(12) United States Patent
Schultz

(10) Patent No.: US 9,006,834 B2
(45) Date of Patent: Apr. 14, 2015

(54) TRENCH SILICIDE AND GATE OPEN WITH LOCAL INTERCONNECT WITH REPLACEMENT GATE PROCESS

(71) Applicant: Advanced Micro Devices, Inc., Sunnyvale, CA (US)

(72) Inventor: Richard T Schultz, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/217,905

(22) Filed: Mar. 18, 2014

(65) Prior Publication Data

US 2014/0197494 A1  Jul. 17, 2014

Related U.S. Application Data

(62) Division of application No. 13/295,574, filed on Nov. 14, 2011, now Pat. No. 8,716,124.

(51) Int. Cl.
  *H01L 29/66* (2006.01)
  *H01L 27/088* (2006.01)
  *H01L 21/768* (2006.01)

(52) U.S. Cl.
  CPC ........ *H01L 27/088* (2013.01); *H01L 21/76895* (2013.01); *H01L 21/76897* (2013.01); *H01L 21/76801* (2013.01)

(58) Field of Classification Search
  CPC .................................................. H01L 27/088
  USPC ................. 257/365, 382, E29.116, E21.577, 257/E21.59, E21.627
  See application file for complete search history.

(56) References Cited

U.S. PATENT DOCUMENTS

| 5,912,507 A | 6/1999 | Dunn et al. |
| 6,136,696 A | 10/2000 | Horiba |

(Continued)

FOREIGN PATENT DOCUMENTS

| WO | 2008154471 | 12/2008 |
| WO | 2010046235 | 4/2010 |

OTHER PUBLICATIONS

International Search Report and Written Opinion in International Application No. PCT/US2012/020464, May 30, 2012, 12 pages.

(Continued)

*Primary Examiner* — Joseph C Nicely
(74) *Attorney, Agent, or Firm* — Meyertons Hood Kivlin Kowert & Goetzel, P.C.; Gareth M. Sampson

(57) ABSTRACT

A semiconductor device fabrication process includes forming insulating mandrels over replacement metal gates on a semiconductor substrate with first gates having sources and drains and at least one second gate being isolated from the first gates. Mandrel spacers are formed around each insulating mandrel. The mandrels and mandrel spacers include the first insulating material. A second insulating layer of the second insulating material is formed over the transistor. One or more first trenches are formed to the sources and drains of the first gates by removing the second insulating material between the insulating mandrels. A second trench is formed to the second gate by removing portions of the first and second insulating materials above the second gate. The first trenches and the second trench are filled with conductive material to form first contacts to the sources and drains of the first gates and a second contact to the second gate.

16 Claims, 24 Drawing Sheets

(56) References Cited

U.S. PATENT DOCUMENTS

| | | |
|---|---|---|
| 6,277,727 B1 | 8/2001 | Kuo et al. |
| 6,368,957 B1 | 4/2002 | Horio |
| 6,501,185 B1 | 12/2002 | Chow et al. |
| 7,037,774 B1 | 5/2006 | Syau |
| 7,126,199 B2 | 10/2006 | Doczy et al. |
| 7,153,727 B2 | 12/2006 | Lee et al. |
| 7,189,927 B2 | 3/2007 | Sakuyama |
| 7,915,111 B2 | 3/2011 | Yang et al. |
| 8,338,284 B2 | 12/2012 | Frohberg et al. |
| 8,564,030 B2* | 10/2013 | Schultz ............ 257/288 |
| 8,716,124 B2* | 5/2014 | Schultz ............ 438/622 |
| 2003/0222352 A1 | 12/2003 | Kung et al. |
| 2004/0002210 A1 | 1/2004 | Goldberg et al. |
| 2004/0082108 A1 | 4/2004 | Thomas et al. |
| 2004/0166667 A1* | 8/2004 | Lee ............ 438/637 |
| 2005/0224966 A1 | 10/2005 | Fogel et al. |
| 2006/0017118 A1* | 1/2006 | Park et al. ............ 257/382 |
| 2007/0134909 A1* | 6/2007 | Klee et al. ............ 438/620 |
| 2007/0145519 A1* | 6/2007 | Peng et al. ............ 257/506 |
| 2009/0032941 A1 | 2/2009 | Mclellan et al. |
| 2009/0072396 A1 | 3/2009 | Wang |
| 2009/0140419 A1 | 6/2009 | Rhyner et al. |
| 2010/0248481 A1 | 9/2010 | Schultz |
| 2011/0291292 A1 | 12/2011 | Frohberg et al. |
| 2012/0025315 A1* | 2/2012 | Kronholz et al. ............ 257/365 |
| 2012/0175772 A1 | 7/2012 | Leung et al. |
| 2012/0313148 A1* | 12/2012 | Schultz ............ 257/288 |
| 2013/0280901 A1 | 10/2013 | Ando et al. |

OTHER PUBLICATIONS

International Search Report and Written Opinion in International Application No. PCT/US2012/062959, Feb. 25, 2013, 14 pages.

* cited by examiner

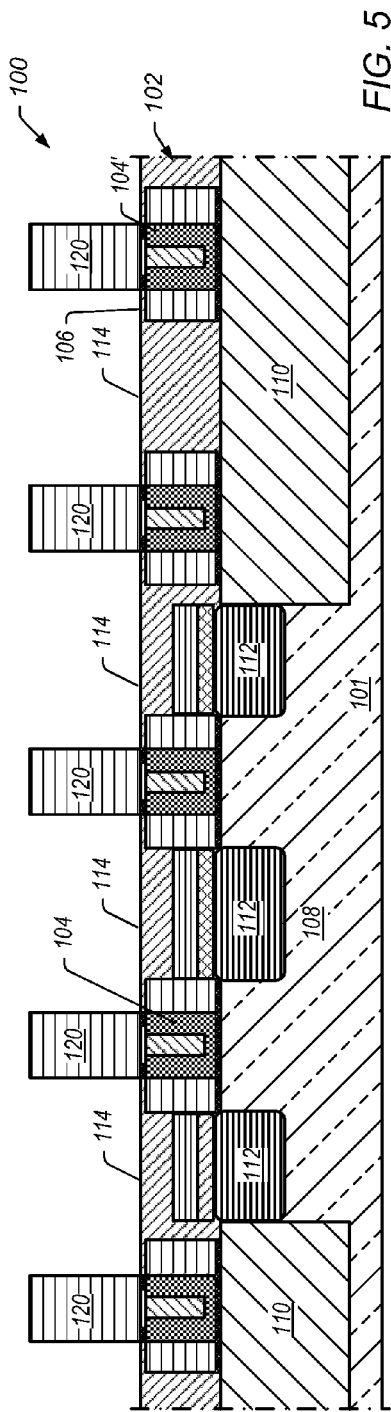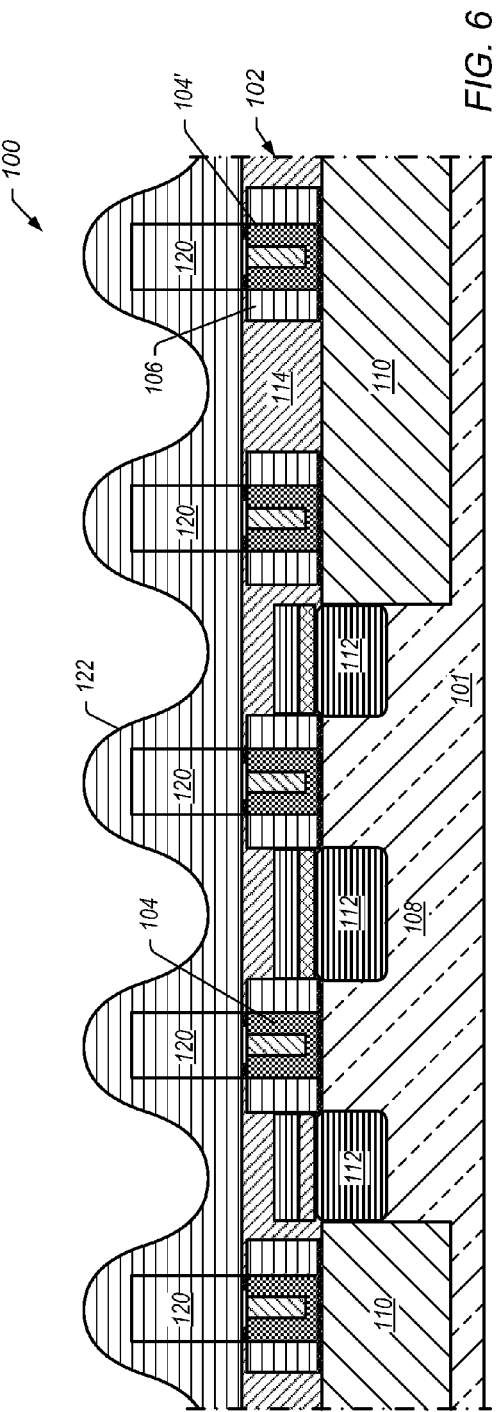

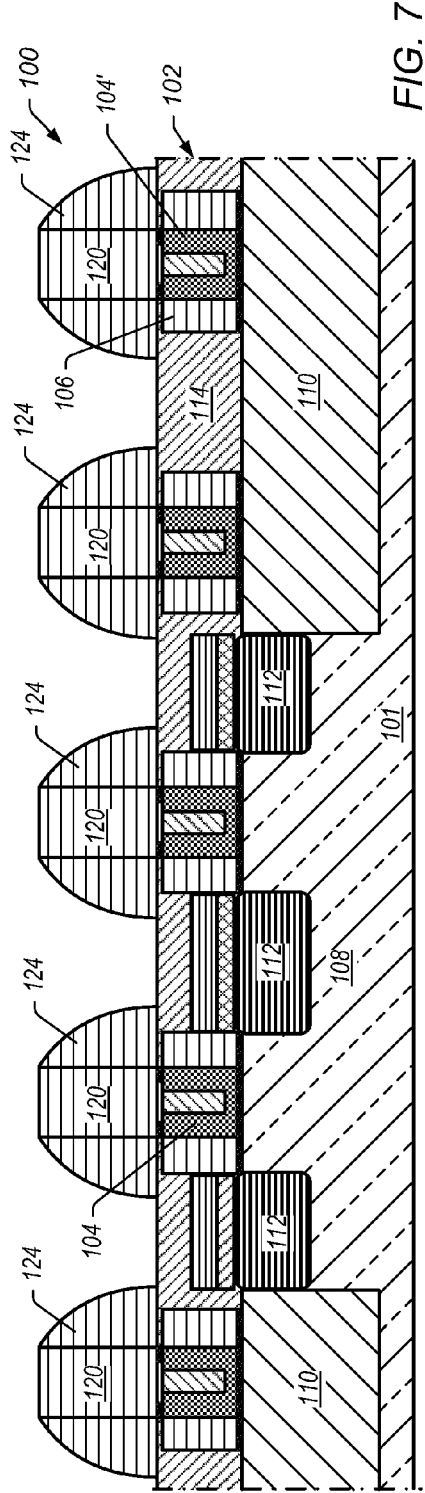
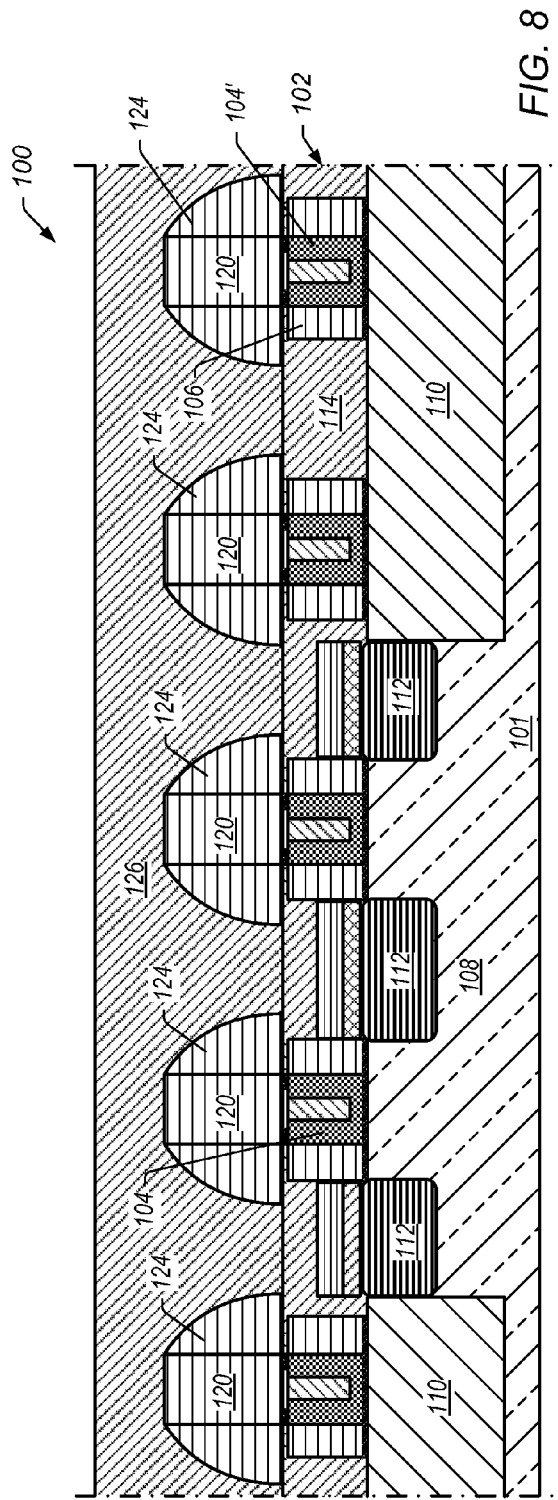

TRENCH SILICIDE AND GATE OPEN WITH LOCAL INTERCONNECT WITH REPLACEMENT GATE PROCESS

PRIORITY INFORMATION

This application is a divisional of U.S. patent application Ser. No. 13/295,574, entitled "TRENCH SILICIDE AND GATE OPEN WITH LOCAL INTERCONNECT WITH REPLACEMENT GATE PROCESS", filed Nov. 14, 2011.

BACKGROUND OF THE INVENTION

1. Field of the Invention

This invention relates generally to semiconductor processes for forming transistors and, more specifically, to processes for forming trench contacts and local interconnects to a replacement gate structure on a semiconductor substrate.

2. Description of the Related Art

Transistors such as planar transistors have been the core of integrated circuits for several decades. The size of the individual transistors has steadily decreased through advances in process development and the need to increase feature density. Current scaling employs 32 nm technologies with development also progressing towards 20 nm and beyond technologies (e.g., 15 nm technologies).

Replacement gate processes (flows) are becoming more commonly utilized as they avoid certain problems found in gate first processes. For example, replacement gate processes may avoid problems associated with the stability of the work function material used in the gates. Replacement gate processes, however, may require the insertion of new process modules such as CMP (chemical mechanical polishing).

Additionally, most replacement gate processes suffer from alignment issues when making trench contacts and/or local interconnect connections to the gate. For example, most replacement gate processes are not self-aligned and can easily fail from misalignment during processing. It may also be difficult to pattern bidirectional local interconnect and/or reduce the number of interface layers from the local interconnect to either the gate or the source/drain of the gate.

To solve some of these issues, process flows have been made that attempt to create a self-aligned trench contact that extends above the gate to allow less complex local interconnect flow. Such process flows, however, are typically very complex, have many resistive interfaces, and have high manufacturing costs due to the complex process flow. Additionally, there is a low manufacturing margin for misalignments or other errors due to the complexity of the processes as these processes may have severely restrictive design and/or alignment rules.

FIG. 1 depicts an embodiment of prior art transistor 50 with replacement gate structure 52 on semiconductor substrate 54. Replacement gate structure 52 includes gates 56 surrounded by gate spacers 58. Source/drains 60 may be located in well region 62 of substrate 54. In addition, one or more gates may be located above isolation region 64 of substrate 54.

Trench contacts 66 are used to contact source/drains 60 to local interconnects 68A. Local interconnects 68A may be merged with local interconnect 68B to provide routing to local interconnect 68C, which is connected to gate 56'.

As can be seen in FIG. 1, any misalignment in trench contacts 66 may easily cause shorting to gates 56. Thus, there must be restrictive design/alignment rules to inhibit shorts between trench contacts 66 and gates 56. In addition, there may easily be alignment issues between local interconnect 68C and gate 56' without restrictive alignment rules.

Also, as seen in FIG. 1, routing between local interconnects 68A, 68B, 68C can be complex and involve many process steps. The numerous process steps may increase the likelihood of resistive interfaces forming between the local interconnects and/or alignment issues between the local interconnects.

Thus, there is a need for a method to self-align trench contacts to the sources/drains and extend the trench contacts above the gates.

SUMMARY OF EMBODIMENTS

In certain embodiments, a semiconductor device fabrication process includes providing a transistor comprising a plurality of replacement metal gates on a semiconductor substrate with first gates having sources and drains and at least one second gate being isolated from the first gates. The transistor includes gate spacers of a first insulating material around each gate and a first insulating layer of a second insulating material between the gates and gate spacers. At least some of the second insulating material overlies sources and drains of the first gates.

One or more insulating mandrels are formed and aligned over the gates. The insulating mandrels include the first insulating material. Mandrel spacers are formed around each insulating mandrel. The mandrel spacers include the first insulating material. A second insulating layer of the second insulating material is formed over the transistor.

One or more first trenches to the sources and drains of the first gates are formed by removing the second insulating material from portions of the transistor between the insulating mandrels. A second trench to the second gate is formed by removing portions of the first insulating material and the second insulating material above the second gate. The first trenches and the second trench are filled with conductive material to form first contacts to the sources and drains of the first gates and a second contact to the second gate.

In some embodiments, a third insulating layer is formed over the transistor. Third trenches are formed through the third insulating layer to the first contacts and the second contact by removing portions of the third insulating layer. Local interconnects to the first contacts and the second contact are formed by depositing conductive material in the third trenches formed through the third insulating layer.

In certain embodiments, a semiconductor device includes a plurality of replacement metal gates on a semiconductor substrate. First gates have sources and drains and at least one second gate is isolated from the first gates. Gate spacers of a first insulating material are around each first gate. A first insulating layer of a second insulating material is between the gate spacers. At least some of the second insulating material overlies sources and drains of the first gates.

One or more insulating mandrels are aligned over the gates. The insulating mandrels include the first insulating material. Mandrel spacers are around each insulating mandrel and include the first insulating material. One or more first contacts to the sources and drains of the first gates are through the first insulating layer between the mandrel spacers. A second contact to the at least one second gate is through the first insulating material above the second gate. A third insulating layer is over the transistor and one or more local interconnects contact the first contacts and the second contact through the third insulating layer.

In some embodiments, one or more of the above process steps is accomplished and/or one or more components of the semiconductor device is formed using a CAD (computer-aided design) designed resist pattern that defines regions to be removed and/or deposited during processing. For example, the CAD pattern may be used to define areas for forming the insulating mandrels and/or the mandrel spacers. In certain embodiments, a computer readable storage medium stores a plurality of instructions which, when executed, generates one or more of the resist patterns.

Providing the self-aligned trench contacts extended above the gate allows a simpler local interconnect scheme to be utilized to connect to the trench contacts and an open gate. Using the process embodiments described herein may allow lower gate to trench contact and local interconnect coupling capacitance as well as reduction in the number of resistive interfaces between layers as compared to previous replacement gate flow connection schemes. In addition, process embodiments described herein may provide a better manufacturing yield by reducing the potential for misalignments between contacts and providing a simpler process flow than previous replacement gate flow connection schemes.

BRIEF DESCRIPTION OF THE DRAWINGS

FIG. 5 depicts a cross-sectional side view of an embodiment of insulating mandrels formed over the gate structure.

FIG. 6 depicts a cross-sectional side view of an embodiment of insulating material deposited over insulating mandrels.

FIG. 7 depicts a cross-sectional side view of an embodiment of insulating the mandrels and mandrel spacers formed over the gate structure.

FIG. 8 depicts a cross-sectional side view of an embodiment of an insulating layer deposited over insulating the mandrels and mandrel spacers.

While the invention is described herein by way of example for several embodiments and illustrative drawings, those skilled in the art will recognize that the invention is not limited to the embodiments or drawings described. It should be understood that the drawings and detailed description hereto are not intended to limit the invention to the particular form disclosed, but on the contrary, the invention is to cover all modifications, equivalents and alternatives falling within the spirit and scope of the present invention as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must). Similarly, the words "include", "including", and "includes" mean including, but not limited to.

Detailed Description Of The Embodiments

Figure 1:
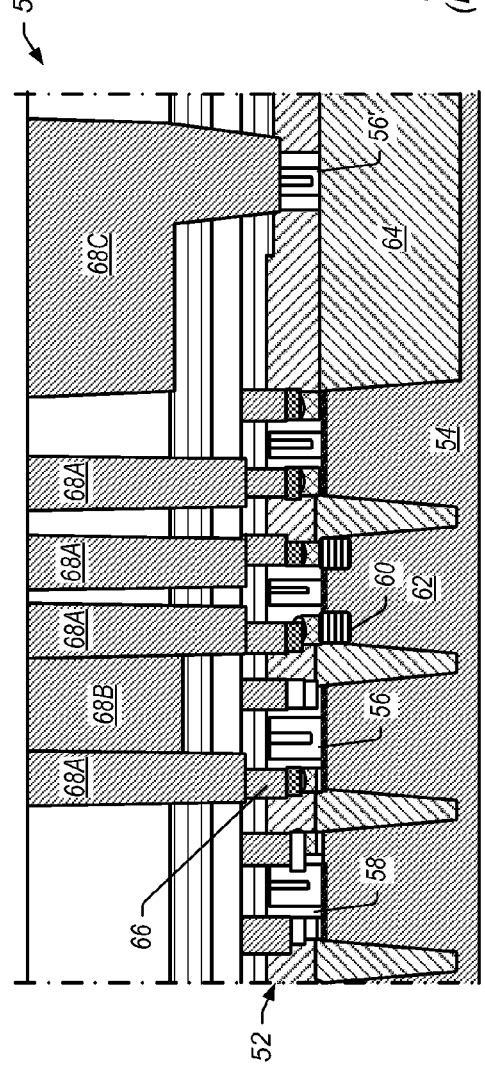
FIG. 1 depicts a cross-sectional side view of a prior art transistor.
Figure 2:
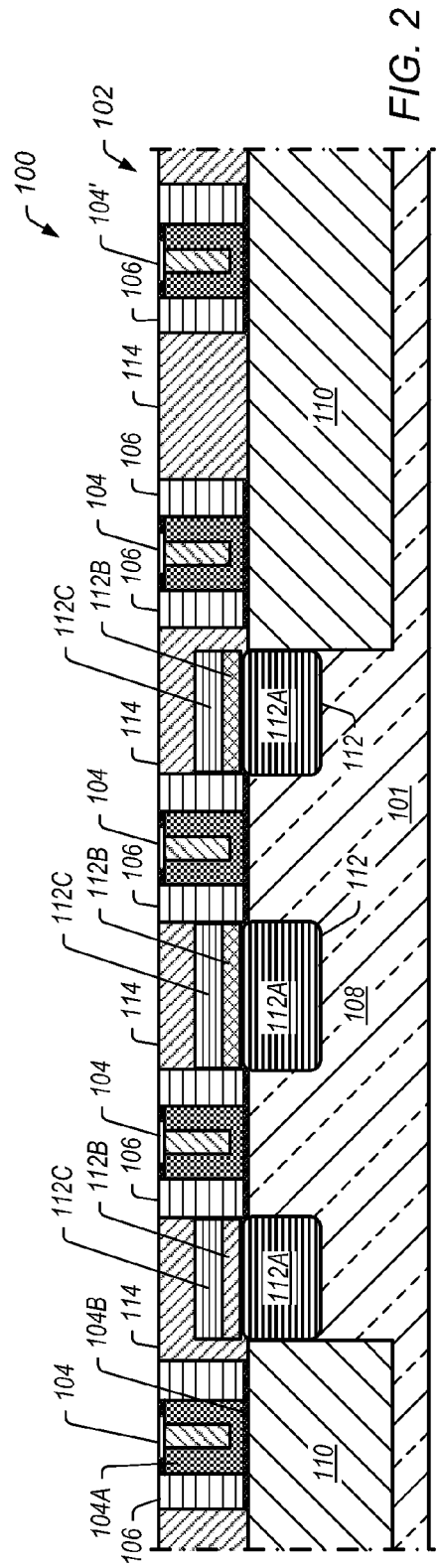
FIG. 2 depicts a cross-sectional side view of an embodiment of a replacement metal gate structure on a silicon substrate.

FIG. 2 depicts a cross-sectional side view of an embodiment of a replacement metal gate structure on a silicon substrate that forms transistor 100. Transistor 100 may be any type of transistor known in the art. For example, transistor 100 may be a planar transistor (e.g., a planar field effect transistor (FET)) or a nonplanar transistor such as a FinFET transistor.

In certain embodiments, transistor 100 includes replacement metal gate structure 102 formed on substrate 101. Gate structure 102 may be formed on substrate 101 by processes known in the art such as, but not limited to, a replacement gate process. As shown in FIG. 2, gate structure 102 includes gates 104 surrounded by gate spacers 106. Gates 104 may be formed above well region 108 of substrate 101 (the active region of transistor 100) and/or above trench isolations 110

(the isolation region of the transistor). Trench isolations 110 may be, in some embodiments, shallow trench isolations.

In certain embodiments, source/drains 112 are formed in well region 108 of substrate 101. In some embodiments, source/drains include embedded silicon germanium (eSiGe) layers 112A with nickel silicide contacts 112C separated by platinum barrier layer 112B. Other types of source/drains may also be used as known in the art.

In certain embodiments, gates 104 are metal gates 104A (e.g., replacement metal gates) formed on a high-κ (high dielectric constant) material 104B, labeled only for the left most gate for clarity purposes in FIG. 2. As described above, metal gates 104A and high-κ material 104B may be formed using a replacement gate process. Metal gates 104A may include metals such as, but not limited to, titanium, tungsten, titanium nitride, or combinations thereof. High-κ material 104B may include dielectrics such as, but not limited to, hafnium silicate, zirconium silicate, hafnium dioxide, zirconium dioxide, or combinations thereof.

As shown in FIG. 2, gates 104 and gate spacers 106 are surrounded by insulating layer 114. In certain embodiments, gate spacers 106 and insulating layer 114 are formed from different insulating materials such that there is etch selectivity between the gate spacers and the insulating layer. For example, gate spacers 106 may be formed from silicon nitride while insulating layer 114 is silicon oxide formed from TEOS (tetraethyl orthosilicate) deposition.

Figure 3:
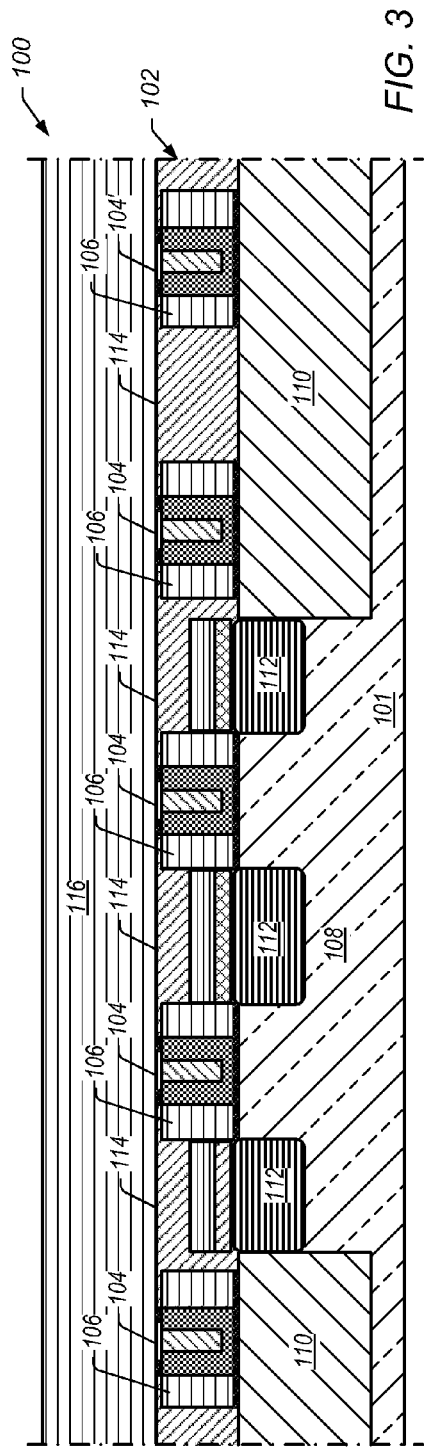
FIG. 3 depicts a cross-sectional side view of an embodiment of an insulating layer formed over the gate structure.

In certain embodiments, replacement metal gate structure 102, shown in FIG. 2 is planarized, for example, by chemical mechanical polishing (CMP). After planarization of gate structure 102, insulating layer 116 is formed (deposited) over the gate structure, as shown in FIG. 3. In certain embodiments, insulating layer 116 includes silicon nitride or the same insulating material as gate spacers 106. Insulating layer 116 may be formed using methods known in the art such as, but not limited to, plasma deposition. In certain embodiments, insulating layer 116 is formed using a planar (non-conforming) deposition process. Insulating layer 116 is formed on gate structure 102 such that the gate structure is encapsulated in the insulating layer.

Figure 4:
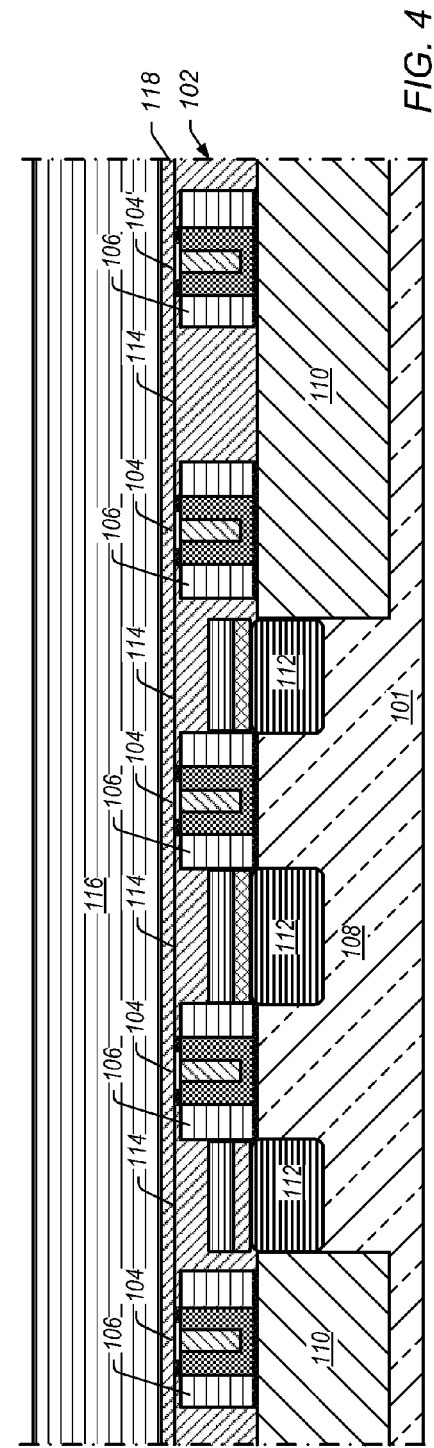
FIG. 4 depicts a cross-sectional side view of an alternative embodiment of an insulating layer with a thin insulating layer underneath formed over the gate structure.

In some embodiments, thin insulating layer 118 is formed (deposited) on gate structure 102 between the gate structure and insulating layer 116, as shown in FIG. 4. Thin insulating layer 118 may include silicon oxide or the same insulating material as insulating layer 114.

Following deposition of insulating layer 116, selected portions of insulating layer 116 may be removed to form insulating mandrels 120 over gates 104, as shown in FIG. 5. For simplicity, not every label is shown for all components in the remaining figures (e.g., not every gate 104 or gate spacer 106). Each mandrel 120 may be formed to have approximately the same width as its underlying gate 104. In certain embodiments, each mandrel 120 is at least as wide as its underlying gate 104 (e.g., the mandrel has a minimum width that is at least as large as the width of the underlying gate but the mandrel may be somewhat wider than the underlying gate). Thus, the edges of each mandrel 120, at the least, extend past the edges of its underlying gate 104. In some cases, because of alignment issues and/or other manufacturing issues, one or more of mandrels 120 have a width less than the width of the underlying gate. The width of the mandrel may be assessed using in-line measurement techniques known in the art. In cases where the mandrel is not as wide as the underlying gate, the smaller width can be compensated for using mandrel spacer widths during later processing steps described herein.

Mandrels 120 may be formed by patterning insulating layer 116 with a resist pattern or mask designed to select portions of the insulating layer to be removed with the remaining portions forming the mandrels above gates 104. The resist pattern or mask used to form mandrels 120 may be a CAD (computer-aided design) designed pattern or mask (e.g., a CAD designed resist pattern). In certain embodiments, a computer readable storage medium stores a plurality of instructions which, when executed, generates resist patterns or mask designs such as, but not limited to, the CAD designed resist pattern or mask used to form mandrels 120. In some embodiments, the resist pattern and/or mask used to form mandrels 120 is the same resist pattern and/or mask used to form gates 104. Using the same resist pattern and/or mask allows mandrels 120 to have approximately the same critical dimensions (e.g., width) as gates 104.

The portions of insulating layer 116 selected for removal by the resist pattern or mask may be removed by, for example, etching of selected portions of the insulating layer. In some embodiments, the etching of insulating layer 116 is a timed etch. The etch process may be timed such that the etch stops at insulating layer 114. In some embodiments, the etch process used to etch insulating layer 116 is selective between insulating layer 116 and insulating layer 114 such that the insulating material in insulating layer 116 is etched but not the insulating material in insulating layer 114. For example, the etch process may etch silicon nitride used in insulating layer 116 but not silicon oxide used in insulating layer 114. The etch process may be timed to stop at insulating layer 114 such that there is no overetch that may etch into gate spacers 106. In some embodiments, an etch stop layer (such as thin insulating layer 118 depicted in FIG. 4) is used as a base layer to inhibit overetching during etching of insulating layer 116.

After formation of mandrels 120, insulating layer 122 is formed (deposited) over the mandrels and insulating layer 114, as shown in FIG. 6. In certain embodiments, insulating layer 122 includes silicon nitride or the same insulating material as mandrels 120. Insulating layer 122 may be formed using methods known in the art such as, but not limited to, plasma deposition. In certain embodiments, insulating layer 122 is formed using non-planar, or conformal, deposition processes. Using non-planar deposition allows the insulating material to conform to the surfaces the material is deposited on such as mandrels 120, as shown in FIG. 6.

Following deposition of insulating layer 122, portions of the insulating layer are removed (etched back) to form mandrel spacers 124, as shown in FIG. 7. Mandrel spacers 124 may be formed around mandrels 120 and abutting the sides (edges) of the mandrels. Mandrel spacers 124 may be formed by removing portions of insulating layer 122 with an etch process that etches downward faster than sideways. Thus, the etch process preferably removes insulating layer material faster from horizontal surfaces than vertical surfaces such as sidewalls. The final width of mandrel spacers 124 may be controlled by controlling etch parameters such as etch bias and etch time during the etch process.

In some embodiments, mandrel spacers 124 have a height similar to mandrels 120. Because of the non-planar (conformal) deposition of insulating layer 122, shown in FIG. 6, mandrel spacers 124 have a tapered (sloped) profile from the top to the bottom of the spacers, as shown in FIG. 7. Thus, mandrel spacers 124 are wider at the bottom and narrower at the top.

In certain embodiments, mandrel spacers 124 are formed with a width such that the edges of mandrel spacers 124 extend beyond the edges of gate spacers 106. The width of mandrel spacers 124 may be tuned by adjusting the etch process used to remove portions of insulating layer 122 (e.g., controlling the etch rate and/or selectivity during the etch process) and/or by adjusting the thickness of insulating layer 122 during deposition of the insulating layer used to form the mandrel spacers. Being able to tune the width of mandrel spacers 124 by adjusting the etch process and/or the deposition thickness allows the width of the mandrel spacers to be controlled on either a lot by lot or wafer by wafer basis.

Following formation of mandrel spacers 124, insulating layer 126 is formed (deposited) over mandrels 120, the mandrel spacers, and insulating layer 114, as shown in FIG. 8. In certain embodiments, insulating layer 126 includes silicon oxide or the same insulating material as insulating layer 114. Insulating layer 126 may be formed using methods known in the art such as, but not limited to, TEOS deposition. In certain embodiments, insulating layer 126 is formed using a planar deposition process. Insulating layer 126 may be formed such that the mandrels 120 and mandrel spacers 124 are encapsulated in the insulating layer.

Figure 9:
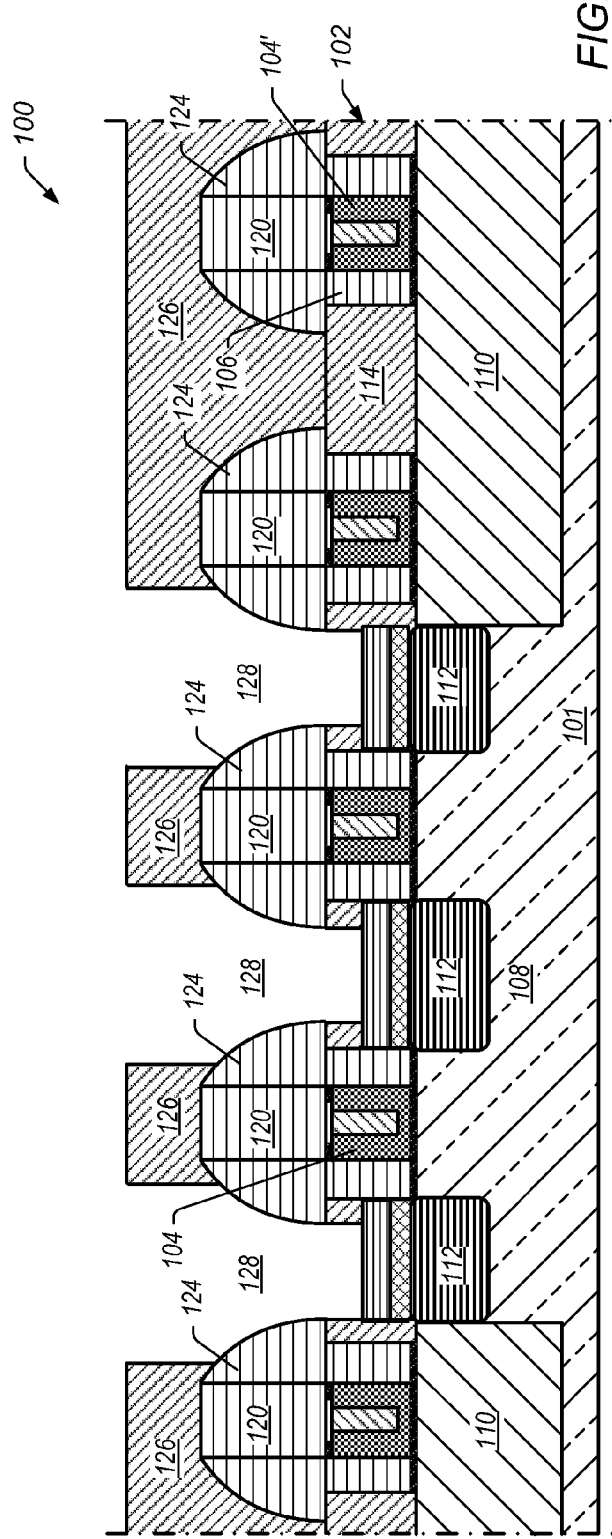
FIG. 9 depicts a cross-sectional side view of an embodiment of trenches formed in the insulating layer deposited over insulating the mandrels and mandrel spacers.

After formation of insulating layer 126, trenches 128 may be formed through insulating layer 126 and insulating layer 114 to sources/drains 112, as shown in FIG. 9. Because insulating layer 126 and insulating layer 114 are formed from the same insulating material, a single etch process may be used to form trenches 128. Trenches 128 may be formed using an etch process that is selective to etch the insulating material (e.g., silicon oxide) in insulating layer 126 and insulating layer 114 but not the insulating material (e.g., silicon nitride) in mandrels 120 and mandrel spacers 124.

At least a portion of mandrel spacers 124 are exposed in trenches 128. Because of the presence of mandrel spacers 124 and the sloped profiles of the mandrel spacers, trenches 128 have profiles that slope from wider at the top to narrower at the bottom. Thus, the slope of trenches 128 is determined by the slope of mandrel spacers 124. Using the selective etch to form trenches 128 inhibits removal of portions of mandrel spacers 124 formed over the edges of gates 104 and gate spacers 106. Maintaining the widths and profiles of mandrel spacers 124 in trenches 128 inhibits exposing portions of gates 104 to contact with material used to fill the trenches even if there is some misalignment in the trenches, mandrels 120, the mandrel spacers, or the gates.

Figure 10:
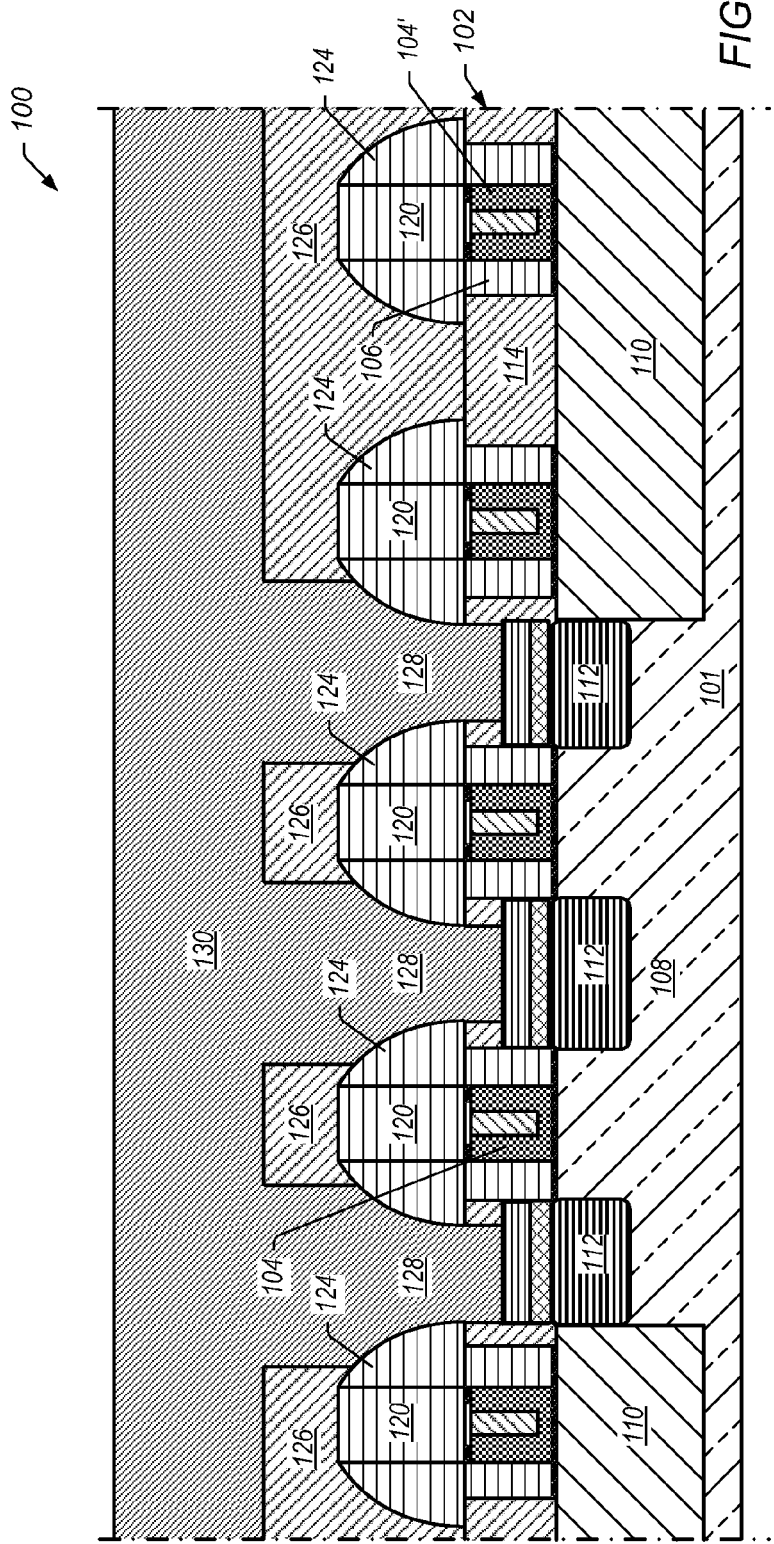
FIG. 10 depicts a cross-sectional side view of an embodiment of the trenches formed in the insulating layer filled with conductive material.

Following formation of trenches 128, the trenches may be filled with conductive material 130, as shown in FIG. 10. Conductive material 130 may include, but not be limited to, tungsten, copper, titanium, titanium nitride, or combinations thereof. Conductive material 130 may be formed as a layer of conductive material using methods known in the art such as, but not limited to, sputter or electroless deposition. In certain embodiments, conductive material 130 is formed using a planar deposition process that encapsulates the underlying layers in the conductive material. Encapsulating the underlying layers in conductive material 130 ensures that trenches 128 are completely filled with the conductive material.

Figure 11:
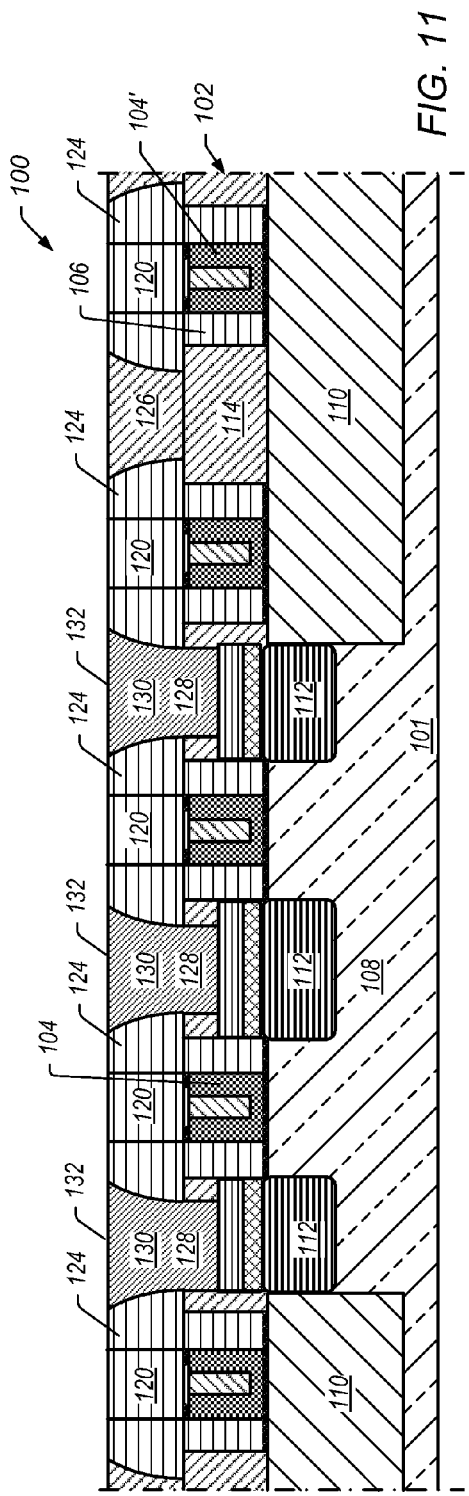
FIG. 11 depicts a cross-sectional side view of an embodiment of the transistor after planarization.

Following filling trenches 128 with conductive material 130, transistor 100 may be planarized, as shown in FIG. 11. Transistor 100 may be planarized by, for example, CMP of the transistor. Planarization of transistor 100 may include removal of materials such that top portions of mandrels 120 and mandrel spacers 124 are exposed at the planar surface. After planarization of transistor 100, conductive material 130 in trenches 128 forms trench contacts 132 to sources/drains 112.

Trench contacts 132 are formed with the profiles of trenches 128 with the trench contacts being wider at the top than at the bottom. Thus, trench contacts 132 have slopes determined by the slopes of mandrel spacers 124. The sloping profile of mandrel spacers 124 and trench contacts 132 inhibits conductive material 130 in the trench contacts 132 from contacting (shorting) to gates 104. For example, shorting between trench contacts and gates may occur in prior art devices if there is any misalignment during formation of the gates, trench contacts, or during other process steps. Because mandrel spacers 124 extend beyond the edges of gates 104 (and gate spacers 106) with the wider bottom profile, as shown in FIG. 11, there is little or no possibility for shorting between trench contacts 132 and gates 104 and the trench contacts are self-aligned.

In certain embodiments, the capacitive coupling from gates 104 to trench contacts 132 is lowered because of the reduced critical dimensions of the trench contacts at the bottom due to the slope and width of mandrel spacers 124. In some embodiments, the width of gates 104 are widened. Gates 104 may be widened without increasing the potential for shorting to trench contacts 132 because of the self-alignment of the trench contacts over sources/drains 112 due to the slope and width of mandrel spacers 124. Widening gates 104 may provide less leakage, better power reduction, and increased performance characteristics. Self-alignment of trench contacts 132 also provides an increased manufacturing margin (e.g., less likelihood for manufacturing problems such as shorting or misalignment).

Figure 12:
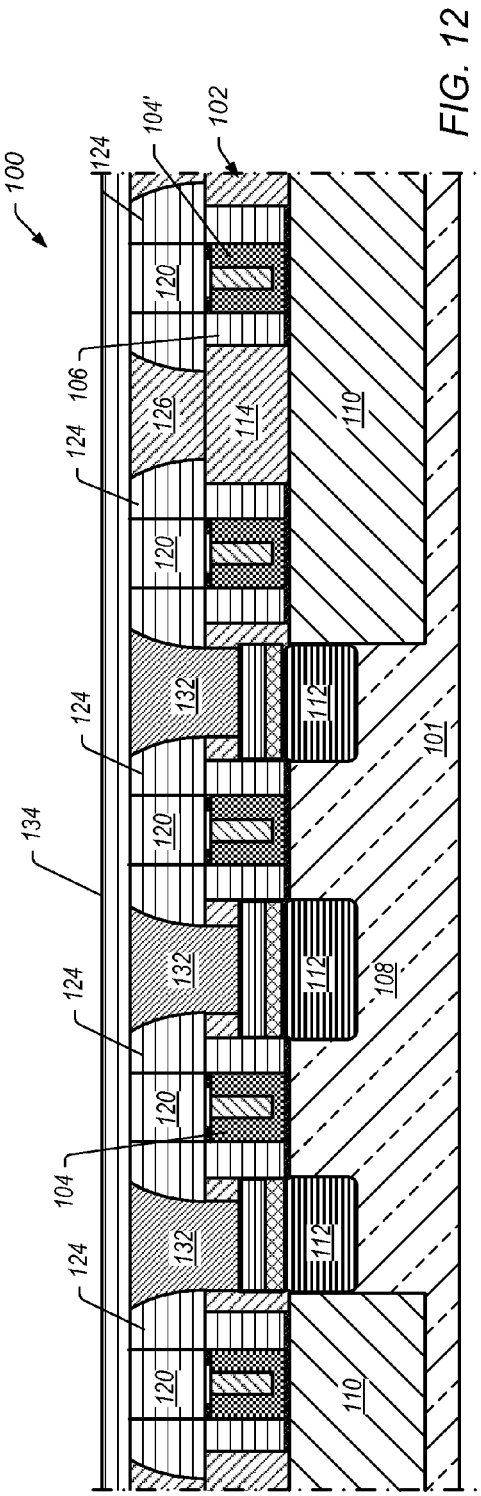
FIG. 12 depicts a cross-sectional side view of an embodiment of an insulating layer deposited over the planarized transistor depicted in FIG. 11.

Following the planarization process, insulating layer 134 is formed (deposited) over the planar surface of transistor 100, as shown in FIG. 12. In certain embodiments, insulating layer 134 includes silicon nitride or the same insulating material as mandrels 120 and mandrel spacers 124. Insulating layer 134 may be formed using methods known in the art such as, but not limited to, plasma deposition. In certain embodiments, insulating layer 134 is formed using a planar deposition process. Insulating layer 134 may be a thin insulating layer that encapsulates the underlying layers.

Figure 13:
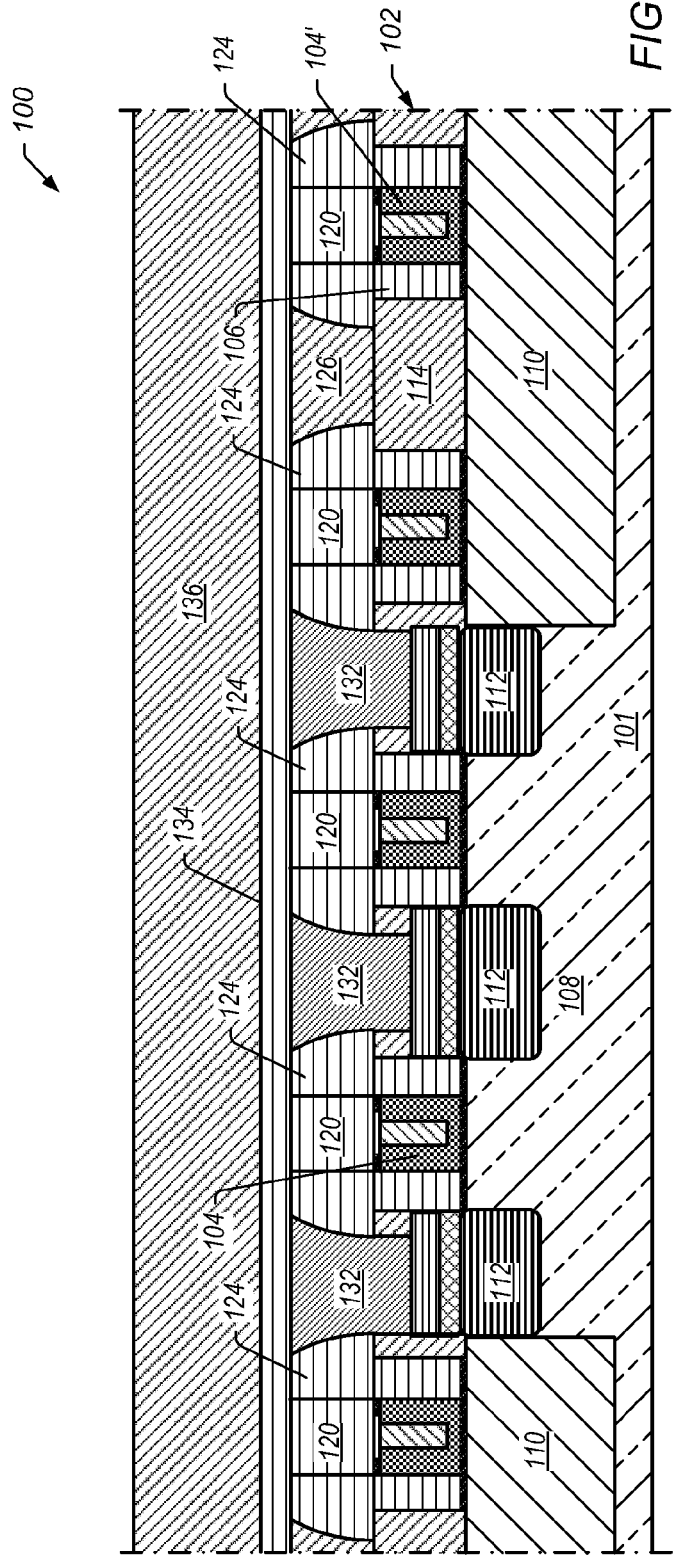
FIG. 13 depicts a cross-sectional side view of an embodiment of a second insulating layer deposited over the insulating layer depicted in FIG. 12.

In certain embodiments, insulating layer 136 is formed (deposited) over the insulating layer 134, as shown in FIG. 13. In certain embodiments, insulating layer 136 includes silicon oxide or the same insulating material as insulating layers 114 and 116. Insulating layer 136 may be formed using methods known in the art such as, but not limited to, TEOS deposition. In certain embodiments, insulating layer 136 is formed using a planar deposition process. Insulating layer 136 may be a thick insulating layer that encapsulates underlying insulating layer 134.

Figure 14:
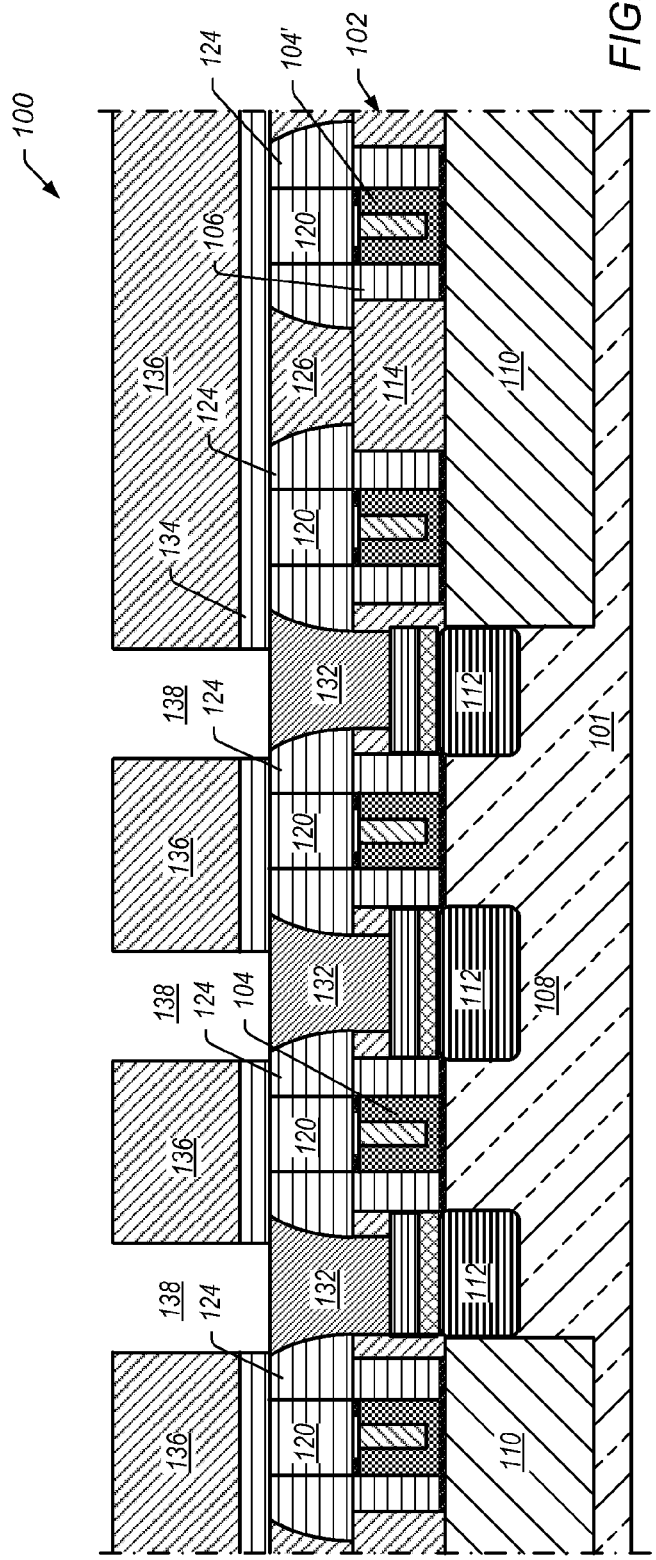
FIG. 14 depicts a cross-sectional side view of an embodiment of trenches formed through the insulating layers depicted in FIG. 13.

Following deposition of insulating layer 136, trenches 138 are formed through insulating layer 136 and insulating layer 134 to trench contacts 132, as shown in FIG. 14. In certain embodiments, trenches 138 are used for local interconnects to trench contacts 132 and source/drains 112. As shown in FIG. 14, the wide top profile of trench contacts 132 provides more tolerance for alignment between trenches 138 (and local interconnects made using the trenches) and the trench contacts.

In certain embodiments, trenches 138 are formed using a two step etch process. The first step may etch through insulating layer 136 (silicon oxide etch) using insulating layer 134 as an etch stop layer. The second step may etch through insulating layer 134 (silicon nitride) to trench contacts 132.

Figure 15:
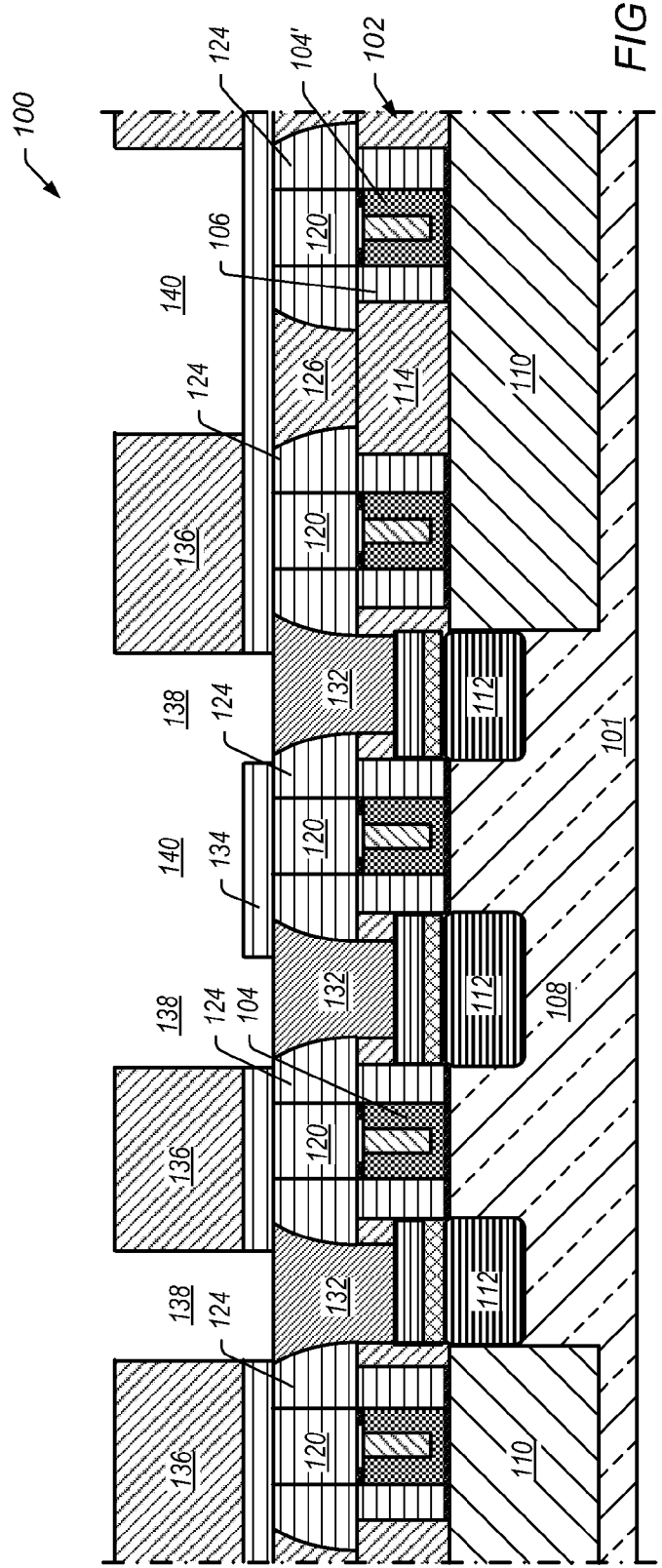
FIG. 15 depicts a cross-sectional side view of an embodiment of more trenches formed through the insulating layers depicted in FIG. 13.

In certain embodiments, trenches 140 are formed through insulating layer 136, as shown in FIG. 15. Trenches 140 may be formed through insulating layer 136 to insulating layer 134 using insulating layer 134 as the etch stop layer. Trenches 140 may be used to form a local interconnect route to gate 104' (gate at right in FIG. 15). Gate 104' may be isolated from other gates in transistor 100 (e.g., gate 104' is in the isolation region of the transistor and the other gates are in the active region).

Combining trenches 140 and trenches 138 above gates other than gate 104' allows the local interconnects to be merged without making a connection to gate 104'.

Figure 16:
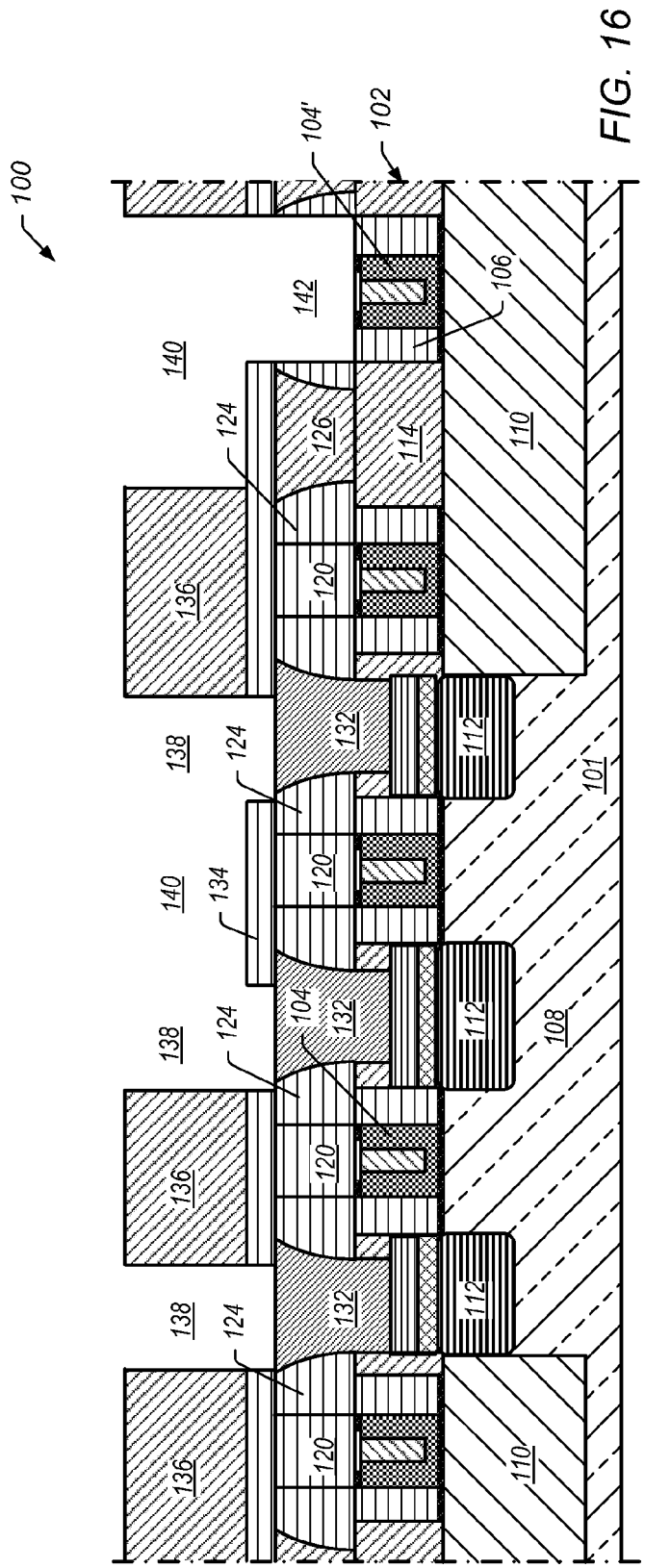
FIG. 16 depicts a cross-sectional side view of an embodiment of a trench formed through a mandrel and mandrel spacer.

After trenches 140 are formed, gate open trench 142 may be formed above the gate to connect to gate 104', as shown in FIG. 16. Trench 142 may be a gate open trench. Trench 142 may be formed by etching through mandrel 120 and mandrel spacer 124 above gate 104' using, for example, a silicon nitride etch process. Connecting to gate 104' using trench 142 allows the gate to be selectively connected to without connecting to other gates in transistor 100. The etch process may be a timed etch process to limit significant overetching into gate spacers 106 around gate 104'. In certain embodiments, the etch process to form trench 142 is a self-aligned process as the etch process is selective to the insulating material of mandrels 120 and mandrel spacers 124 (e.g., silicon nitride) and the etch process will not etch into insulating layer 114 (silicon oxide). The combination of trenches 138, trenches 140, and trench 142 may provide a simple, bidirectional local interconnect scheme for routing between trench contacts 132 (contacting source/drains 112) and gate 104'.

In some embodiments, a first etch process for insulating material in insulating layer 136 may be used form trenches 140 and the portions of trenches 138 in insulating layer 136. A second etch process may then be used to remove portions of insulating layer 134 in trenches 138 using a mask to keep insulating layer 134 from being etched below trenches 140. In some embodiments, the second etch process for insulating layer 134 may also be used to form trench 142 to gate 104'.

Figure 17:
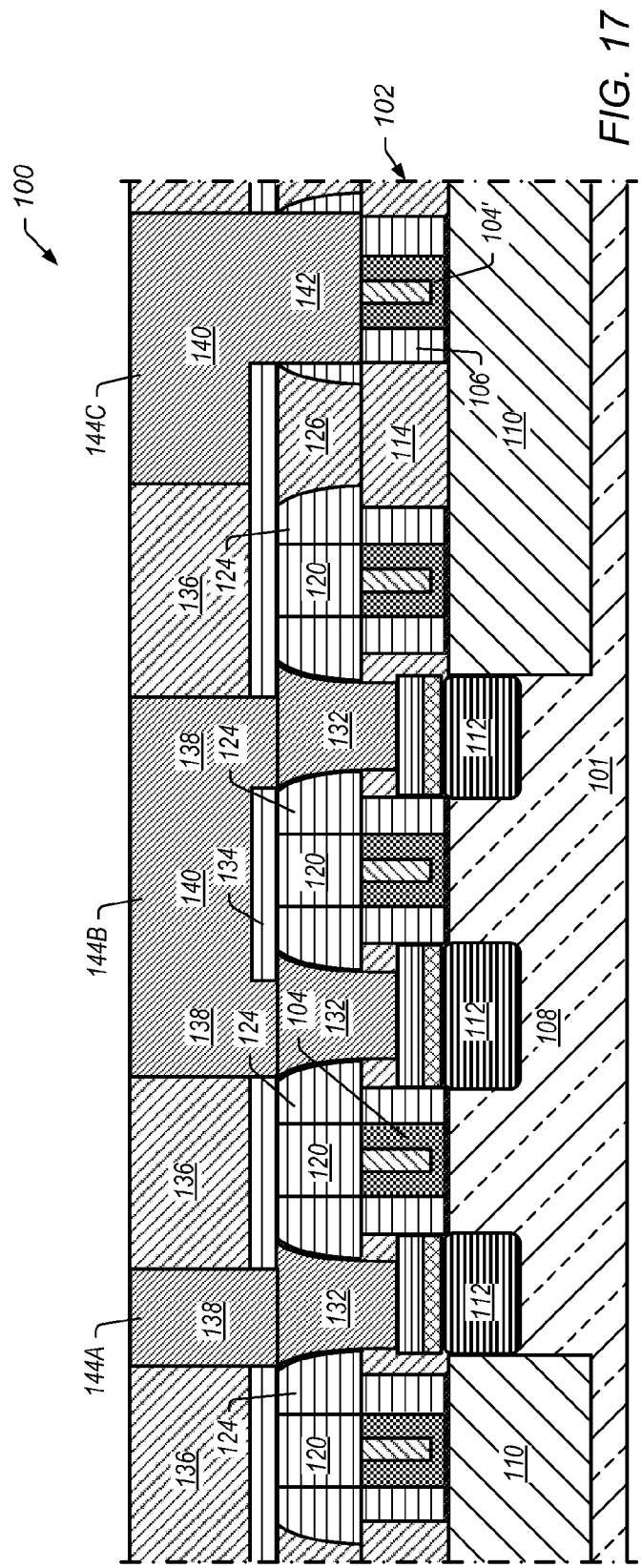
FIG. 17 depicts a cross-sectional side view of an embodiment of transistor 100 with local interconnects to sources/drains and a gate.

Filling of trenches 138, trenches 140, and trench 142 with conductive material forms local interconnects 144A, 144B, and 144C, as shown in FIG. 17. In certain embodiments, trenches 138, trenches 140, and trench 142 are filled simultaneously with conductive material. The conductive material used to form local interconnects 144A, 144B, and 144C may be the same material used to form trench contacts 132 (e.g., tungsten or copper). In certain embodiments, local interconnects 144A, 144B, and 144C are thicker than local interconnects used in other routing schemes because of the bidirectional routing and use of gate open trench 142. Using thicker local interconnects may improve transistor performance by providing lower resistances in the local interconnect layer.

Figure 18:
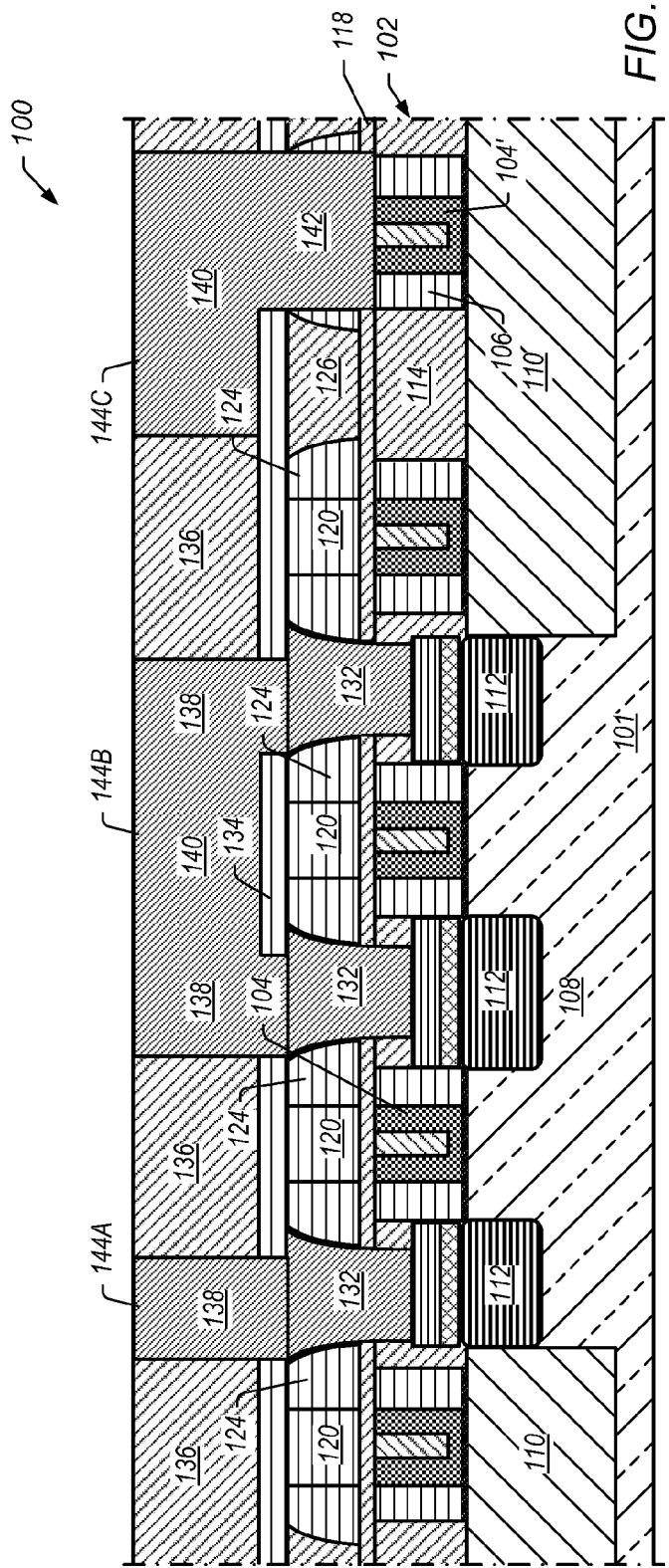
FIG. 18 depicts an alternative embodiment of transistor 100 from the embodiment depicted in FIG. 17.

In certain embodiments, transistor 100 is planarized (e.g., using CMP) after filling of trenches 138, trenches 140, and trench 142 with conductive material to form the planar surface shown in FIG. 17. FIG. 18 depicts an alternative embodiment of transistor 100 that is differentiated from the embodiment depicted in FIG. 17 by the use of thin insulating layer 118, depicted in the embodiment shown in FIG. 4, underneath insulating layer 116.

As shown in FIGS. 15-18, the process to form local interconnect 144C includes etching (forming trenches) and/or filling trenches with relatively large step heights. For example, a large step height is present when forming gate open trench 142 to gate 104' through trench 140 in insulating layer 136, as shown in FIG. 16. Such large step heights may be difficult to controllably etch and fill because of the large change in height during the process. For example, it may be difficult to control the aspect ratio of gate open trench 142 because of the large step in height between the top surface of the device (the top of insulating layer 136) and the upper surface of gate 104'.

To overcome the issue with large step heights and to provide a simpler process flow that provides better yield, it may be possible to provide a process that allows for filling of the gate open trench and the trench contacts in a single process. Filling the gate open trench and the trench contacts at the same time may provide a simpler process with reduced step heights during etching and filling steps associated with forming local interconnect to the gate open.

Figure 19:
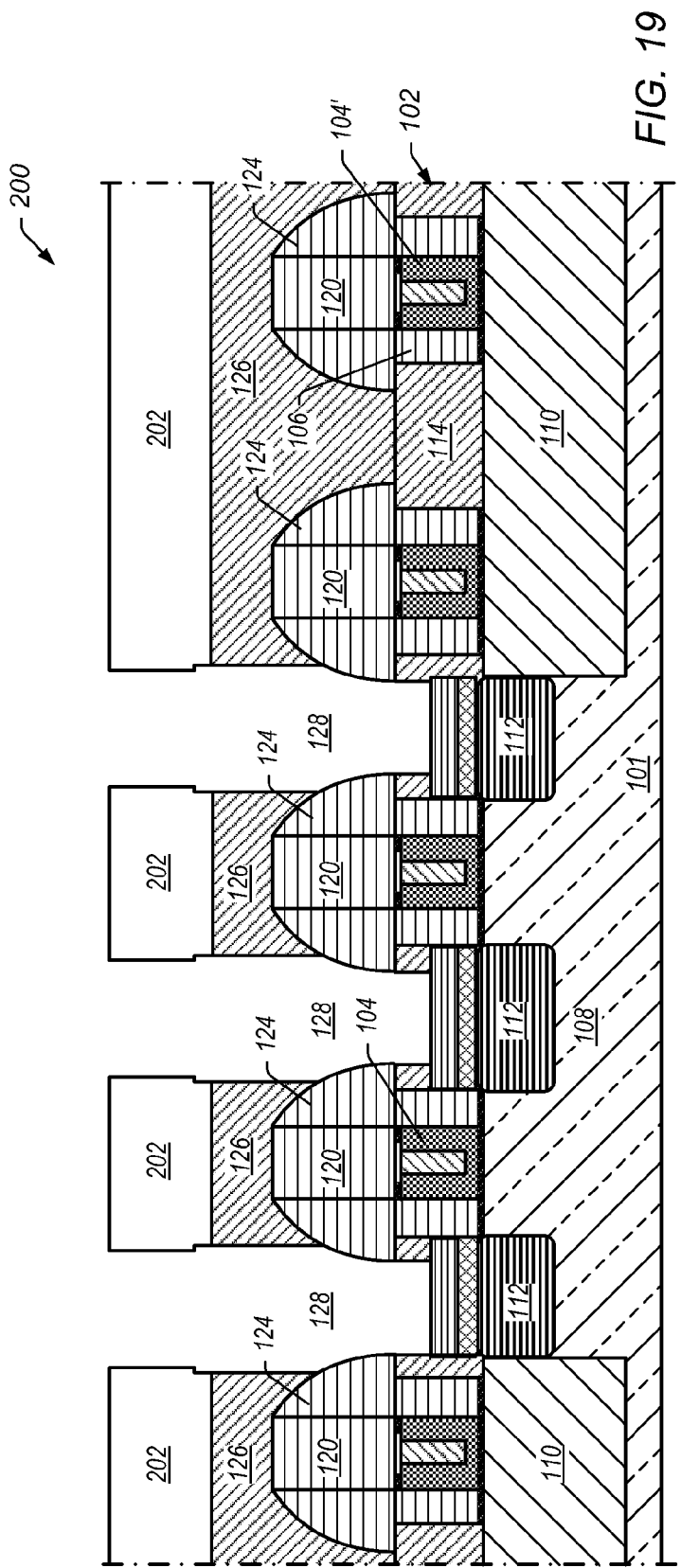
FIG. 19 depicts a cross-sectional side view of an embodiment of trenches formed through insulating layers to sources/drains using a resist pattern.

FIGS. 19-29 depict cross-sectional side views of structures of transistor 200 formed using an alternate process for forming trench contacts and local interconnects continuing from the structure of transistor 100 depicted in FIG. 8 (e.g., transistor 200 is an alternate embodiment of transistor 100). After formation of insulating layer 126, as shown in FIG. 8, trenches 128 are formed through insulating layer 126 and insulating layer 114 to sources/drains 112 using a resist pattern formed from resist 202, as shown in FIG. 19. Trenches 128 may be formed using an etch process that is selective to etch the insulating material (e.g., silicon oxide) in insulating layer 126 and insulating layer 114 but not the insulating material (e.g., silicon nitride) in mandrels 120 and mandrel spacers 124.

Figure 20:
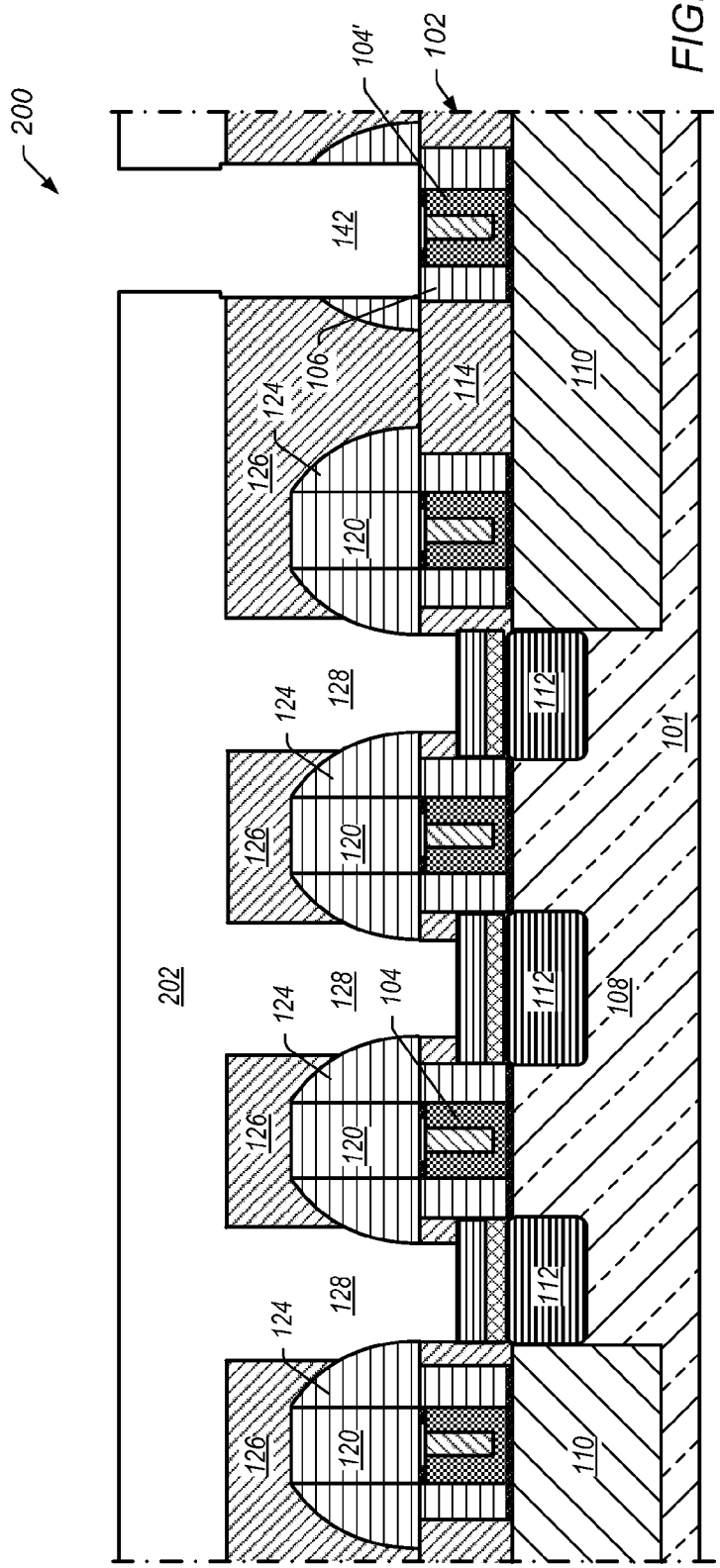
FIG. 20 depicts a cross-sectional side view of an embodiment of a gate open trench through insulating layers to a gate.

Following formation of trenches 128, transistor 200 may be patterned with another resist pattern formed from resist 202 to form gate open trench 142, as shown in FIG. 20. Trench 142 may be formed by etching insulating layer 126 to mandrel 120 using a first etch process (e.g., a silicon oxide etch process) and then etching through mandrel 120 and mandrel spacer 124 above gate 104' (the isolated gate) using a second etch process (e.g., a silicon nitride etch process). In some embodiments, mandrel 120 and mandrel 124 are used as an etch stop layer for the first etch process. In some embodiments, a third etch process is needed to etch through insulating layer 118 (shown in FIG. 4), which may be used as an etch stop layer for the second etch process.

In some embodiments, one or more of the etch processes are timed etch processes to limit significant overetching (e.g., into gate spacers 106 around gate 104'). In certain embodiments, the second etch process to form trench 142 is a self-aligned process as the second etch process is selective to the insulating material of mandrels 120 and mandrel spacers 124 (e.g., silicon nitride) and the second etch process will not etch into insulating layer 114 (silicon oxide).

Because gate open trench 142 is formed immediately after formation of trenches 128, as shown in FIG. 20, the etch process for forming the gate open trench is a shallower etch than shown in the embodiment for forming the gate open trench described for FIG. 16, which involves several intermediate steps between forming trenches 128 and gate open trench 142. The shallower etch process provides improved control of aspect ratios in gate open trench 142. As shown in FIG. 20, resist 202 used to form the resist pattern for gate open trench 142 may fill trenches 128 to inhibit etching of trenches 128 during formation of the gate open trench.

Figure 21:
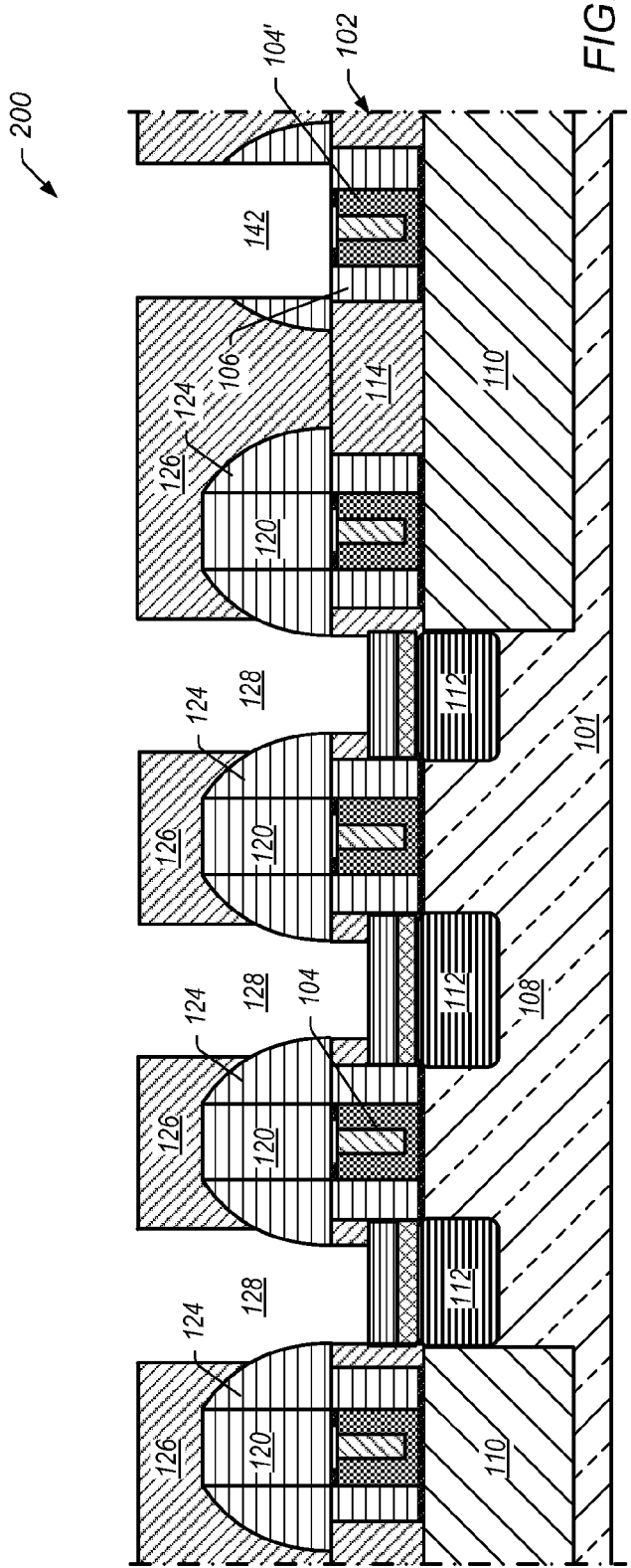
FIG. 21 depicts a cross-sectional side view of the embodiment of depicted in FIG. 20 with the resist pattern removed.
Figure 22:
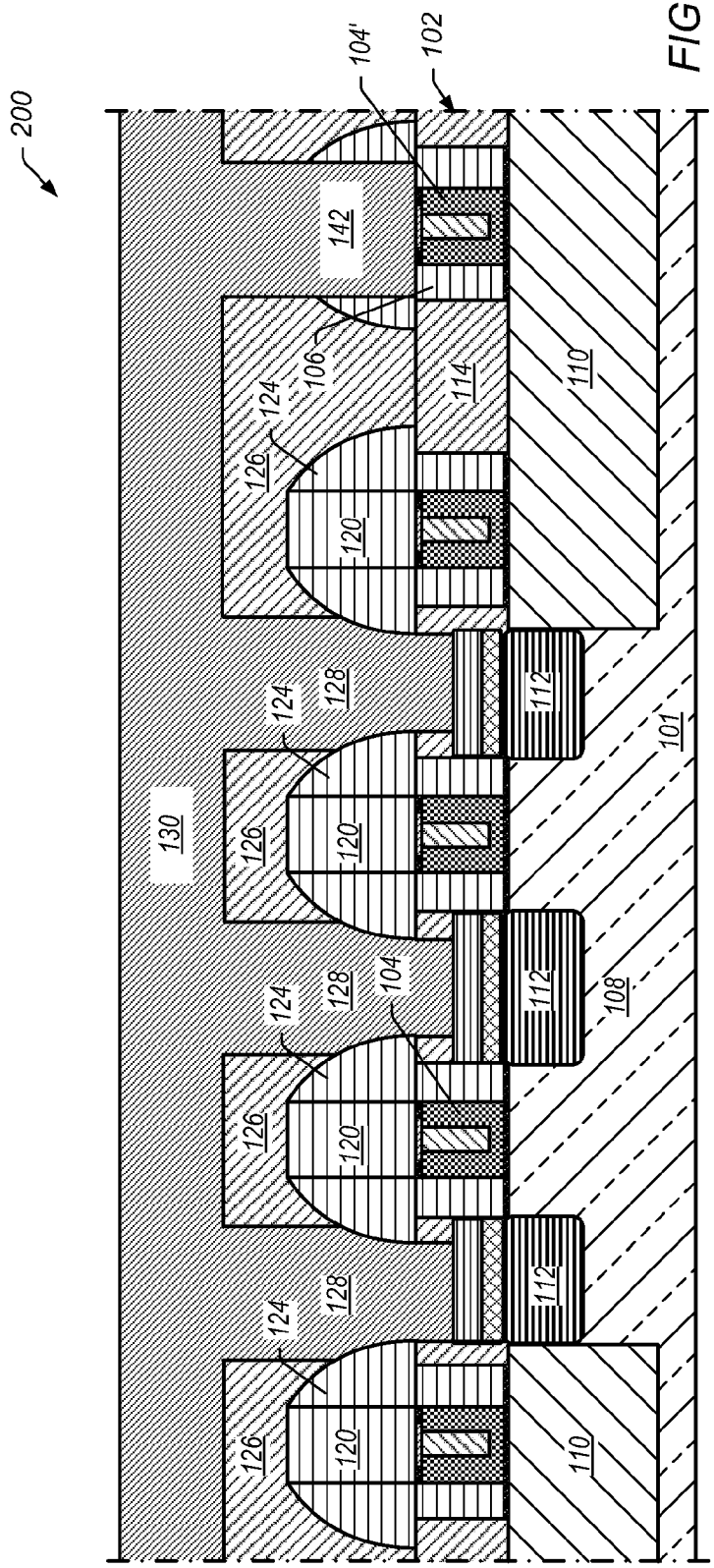
FIG. 22 depicts a cross-sectional side view of an embodiment of the trenches, including the gate open trench, formed in the insulating layers filled with conductive material.

After formation of gate open trench 142, resist 202 may be removed to expose trenches 128 and the gate open trench, as shown in FIG. 21. Trenches 128 and gate open trench 142 may have relatively similar step heights. Following removal of the resist, trenches 128 and gate open trench 142 are filled with conductive material 130, as shown in FIG. 22. In certain embodiments, trenches 128 and gate open trench 142 are filled with conductive material 130 in a single process (e.g., the same process).

Conductive material 130 may include, but not be limited to, tungsten, copper, titanium, titanium nitride, or combinations thereof. Conductive material 130 may be formed as a layer of conductive material using methods known in the art such as, but not limited to, sputter or electroless deposition. In certain embodiments, conductive material 130 is formed using a planar deposition process that encapsulates the underlying layers in the conductive material. Encapsulating the underlying layers in conductive material 130 ensures that trenches 128 and gate open trench 142 are completely filled with the conductive material.

Figure 23:
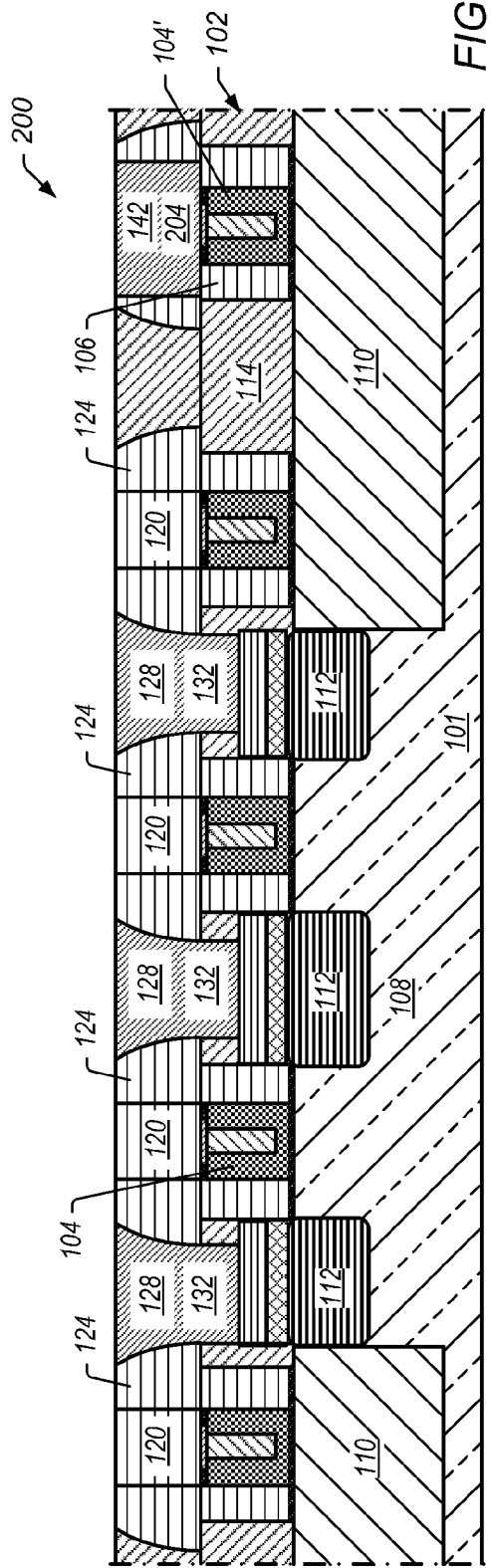
FIG. 23 depicts a cross-sectional side view of an embodiment of the transistor depicted in FIG. 22 after planarization.

Following filling trenches 128 and gate open trench 142 with conductive material 130, transistor 200 may be planarized, as shown in FIG. 23. Transistor 200 may be planarized by, for example, CMP of the transistor. Planarization of transistor 200 may include removal of materials such that top portions of mandrels 120 and mandrel spacers 124 are exposed at the planar surface. After planarization of transistor 200, conductive material 130 in trenches 128 forms trench contacts 132 to sources/drains 112 and conductive material 130 in gate open trench 142 forms gate open trench contact 204 to gate 104'.

Figure 24:
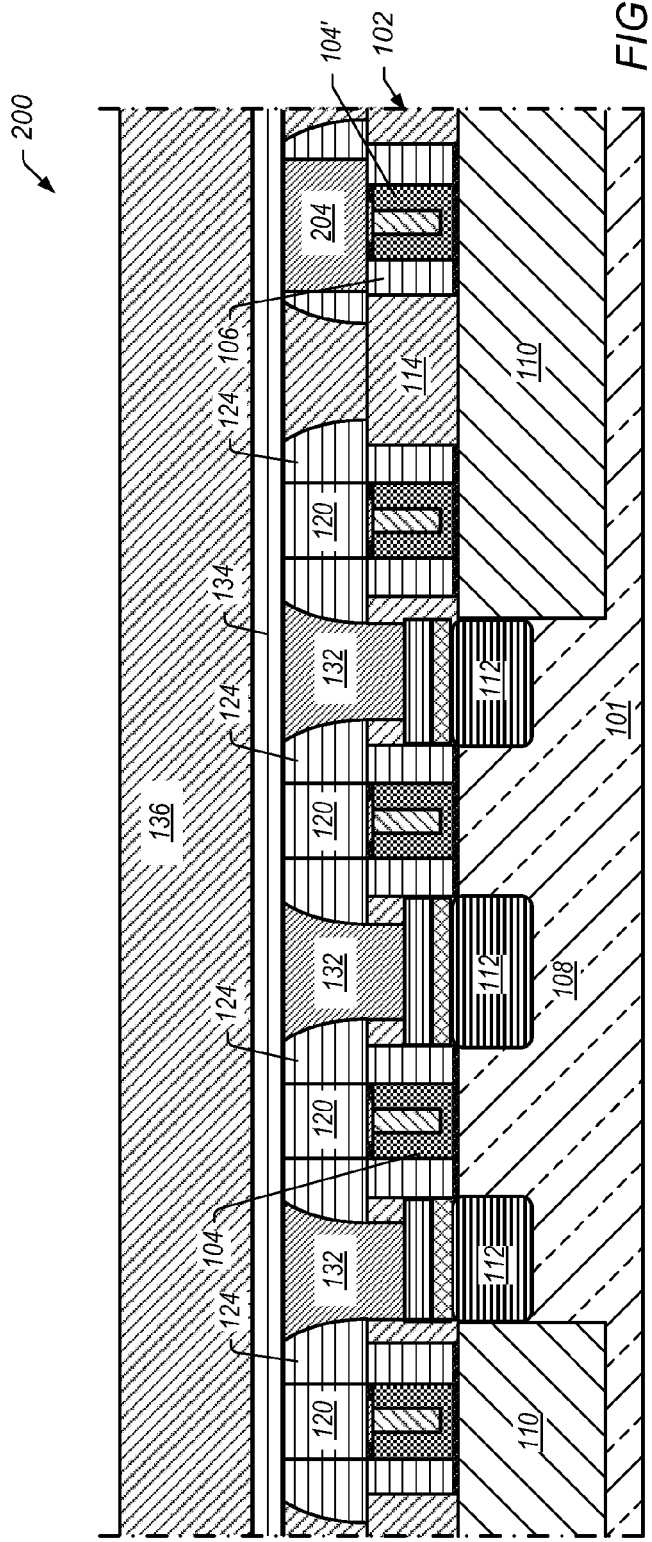
FIG. 24 depicts a cross-sectional side view of an embodiment of an insulating layer deposited over the planarized transistor depicted in FIG. 23.

Following the planarization process, insulating layer 134 and insulating layer 136 are formed (deposited) over the planar surface of transistor 200, as shown in FIG. 24. In certain embodiments, insulating layer 134 includes silicon nitride or the same insulating material as mandrels 120 and mandrel spacers 124. Insulating layer 134 may be formed using methods known in the art such as, but not limited to, plasma deposition. In certain embodiments, insulating layer 134 is formed using a planar deposition process. Insulating layer 134 may be a thin insulating layer that encapsulates the underlying layers.

In certain embodiments, insulating layer 136 includes silicon oxide or the same insulating material as insulating layers 114 and 116. Insulating layer 136 may be formed using methods known in the art such as, but not limited to, TEOS deposition. In certain embodiments, insulating layer 136 is formed using a planar deposition process. Insulating layer 136 may be a thick insulating layer that encapsulates underlying insulating layer 134.

Figure 25:
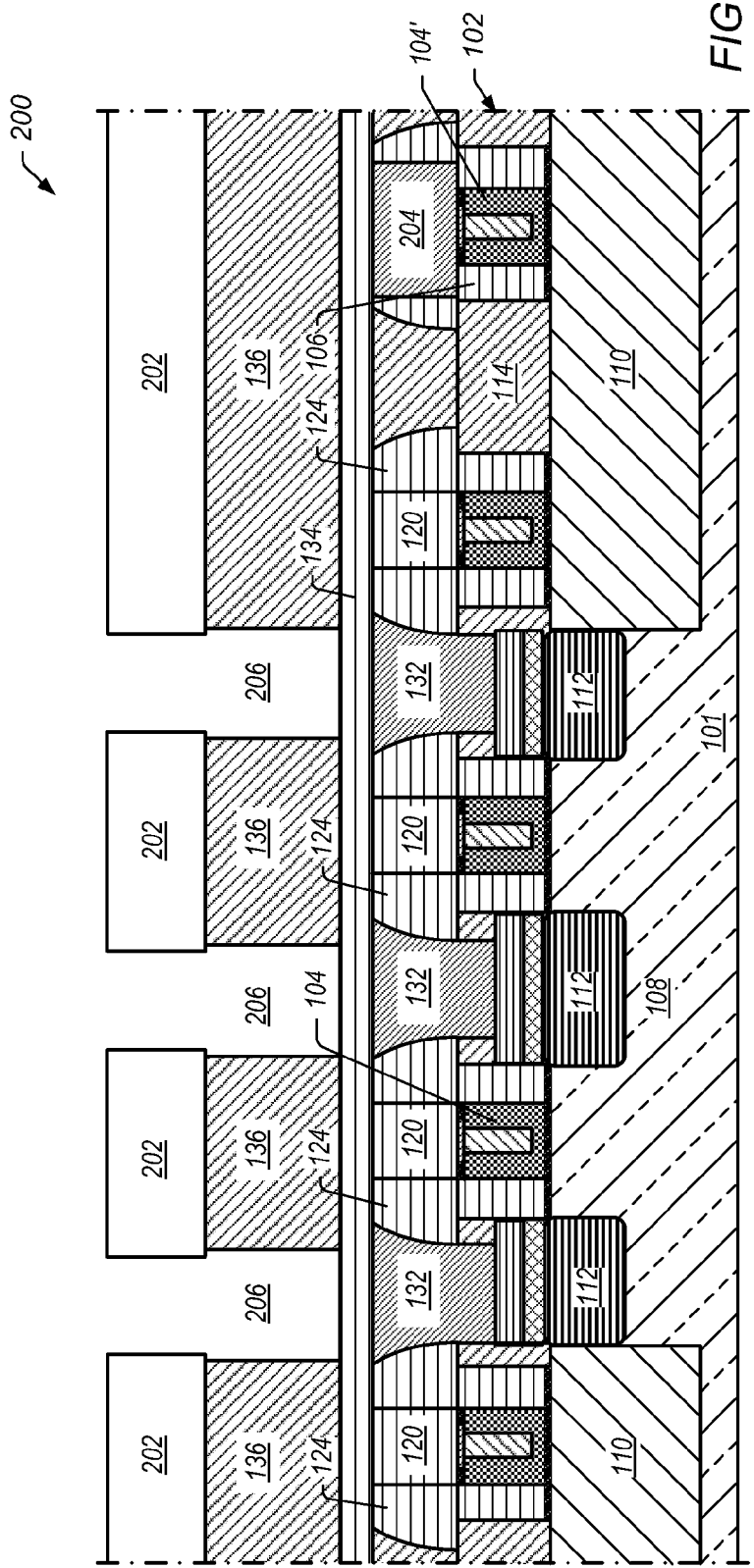
FIG. 25 depicts a cross-sectional side view of an embodiment of trenches formed through the insulating layers depicted in FIG. 24 using a resist pattern.

Following deposition of insulating layer 136, trenches 206 are formed through insulating layer 136 using a resist pattern formed from resist 202, as shown in FIG. 25. In certain embodiments, insulating layer 134 is used as an etch stop layer for formation of trenches 206 through insulating layer 136. In some embodiments, insulating layer 134 is not used (there is no etch stop layer). In embodiments without the etch stop layer, a timed etch is used to control the depth of trenches 206 formed through insulating layer 136. Timed etching may, however, if not controlled properly, have potential problems with overetching.

Figure 26:
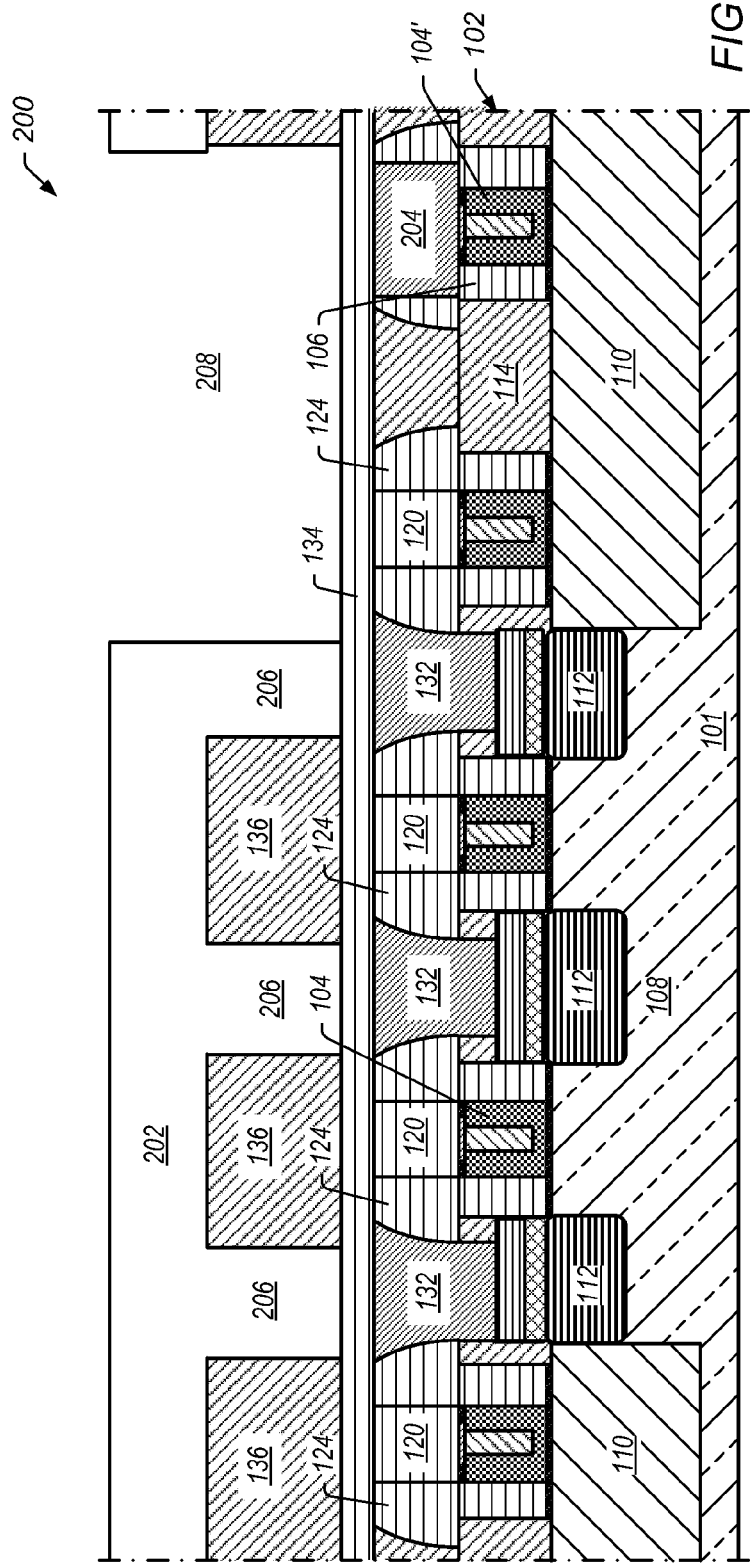
FIG. 26 depicts a cross-sectional side view of an embodiment of an additional trench formed through the insulating layers depicted in FIG. 25 using a resist pattern.

Following formation of trenches 206, another resist pattern formed from resist 202 may be used to form trench 208 through insulating layer 136, as shown in FIG. 26. Trench 208 may be formed through insulating layer 136 to insulating layer 134 using insulating layer 134 as the etch stop layer or trench 208 may be formed, without insulating layer 134, using a timed etch.

Figure 27:
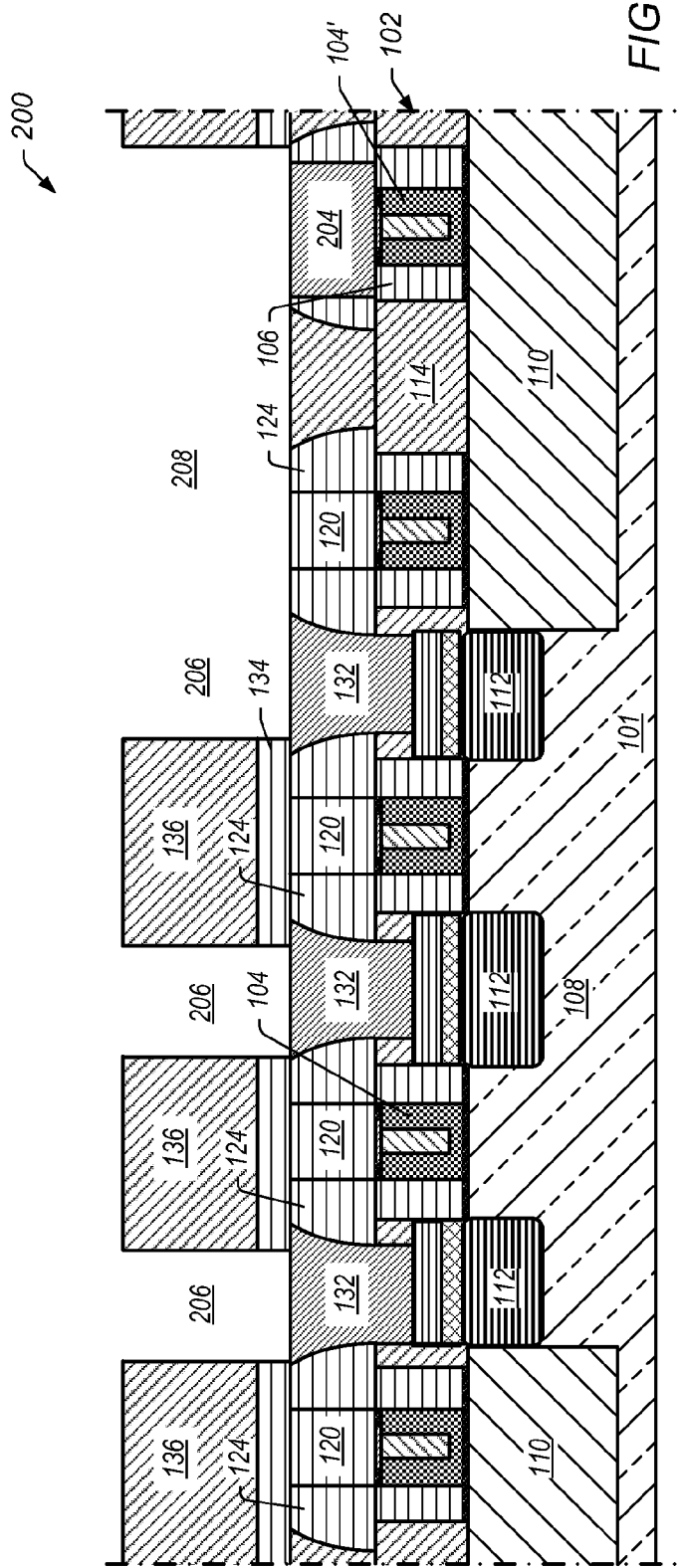
FIG. 27 depicts a cross-sectional side view of the embodiment of depicted in FIG. 26 with the resist pattern removed.

To complete formation of trenches 206 and trench 208, insulating layer 134 may be removed from the trenches using an etch process and resist 202 may be removed from the surface of transistor 200, as shown in FIG. 27. In certain embodiments, the etch process to remove insulating layer 134 is a timed etch process to inhibit overetching into mandrels 120 and mandrel spacers 124 exposed in trench 208.

In certain embodiments, trenches 206 are used for local interconnects to trench contacts 132 and source/drains 112. Trench 208 may be used to form a local interconnect route to gate 104' (gate at right in FIG. 27). In certain embodiments, trench 208 is combined with one of trenches 206 to merge the local interconnect for gate 104' (the isolated gate) and the local interconnects for trench contacts 132 and source/drains 112. The combination of trenches 206 and trench 208 may provide a simple, bidirectional local interconnect scheme for routing between trench contacts 132 (contacting source/drains 112) and gate 104'.

Figure 28:
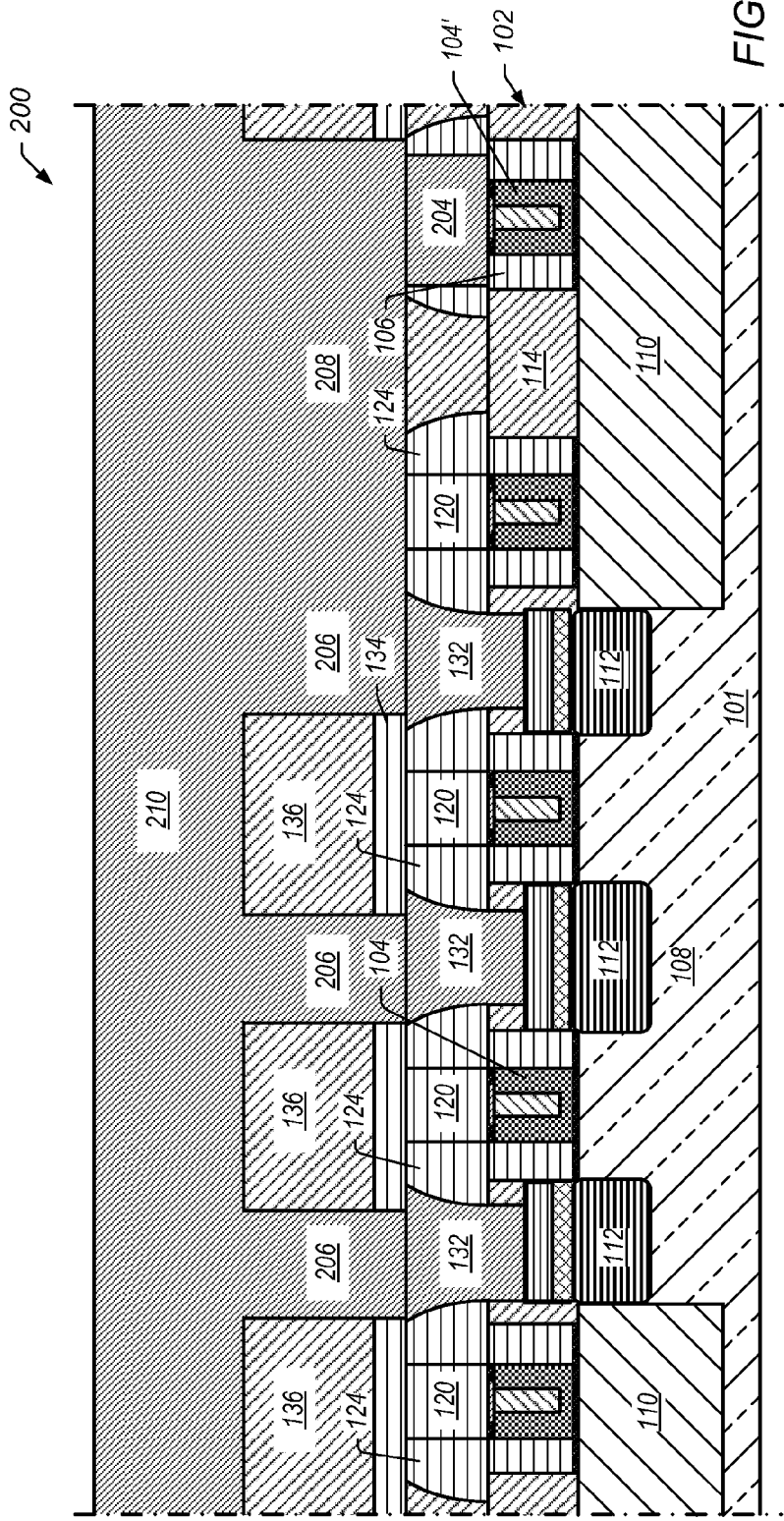
FIG. 28 depicts a cross-sectional side view of an embodiment of the trenches depicted in FIG. 27 filled with conductive material.

After removal of insulation layer 134, trenches 206 and trench 208 may be filled with conductive material 210, as shown in FIG. 28. Conductive material 210 may include, but not be limited to, tungsten, copper, titanium, titanium nitride, or combinations thereof. Conductive material 210 may be formed as a layer of conductive material using methods known in the art such as, but not limited to, sputter or electroless deposition. Conductive material 210 may be the same material used to form trench contacts 132 (e.g., conductive material 130). In certain embodiments, conductive material 210 is formed using a planar deposition process that encapsulates the underlying layers in the conductive material. Encapsulating the underlying layers in conductive material 210 ensures that trenches 206 and trench 208 are completely filled with the conductive material.

Figure 29:
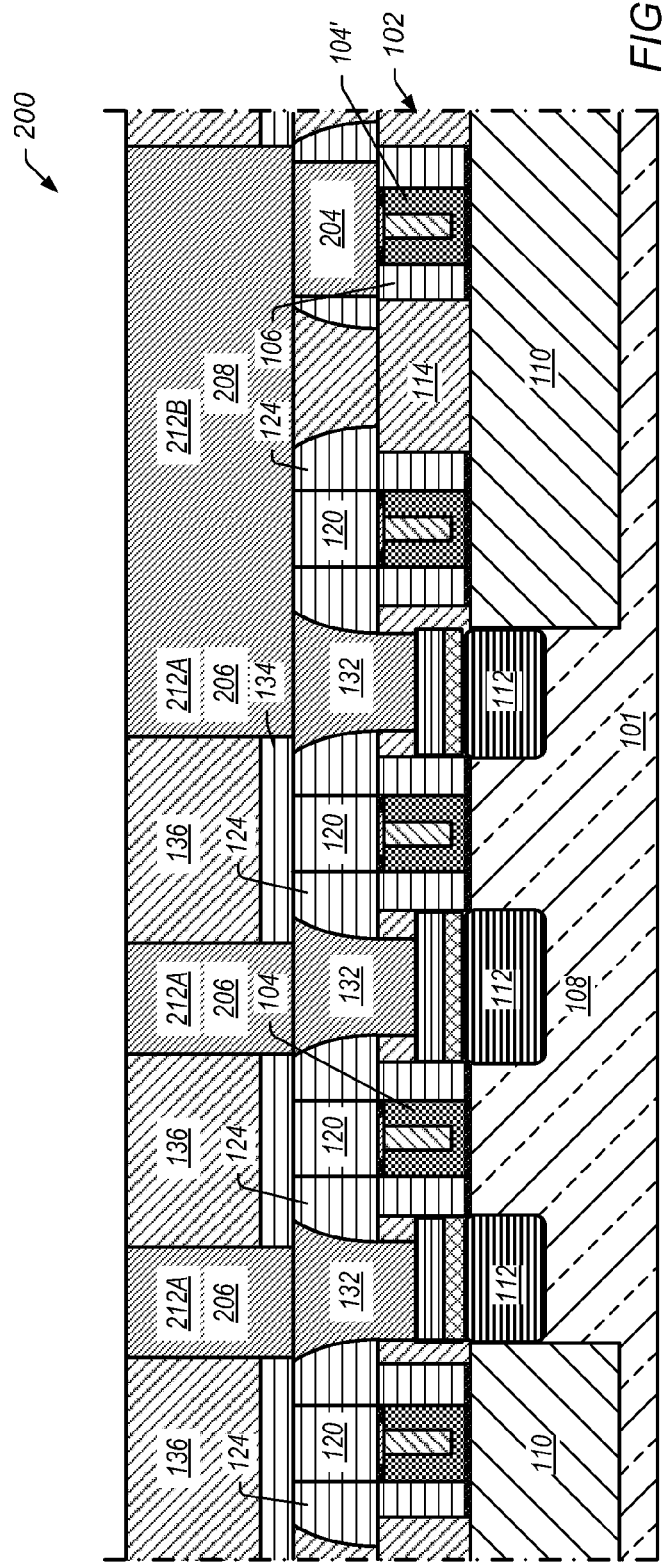
FIG. 29 depicts a cross-sectional side view of an embodiment of the transistor depicted in FIG. 28 after planarization.

Following filling trenches 206 and trench 208 with conductive material 210, transistor 200 may be planarized (e.g., using CMP), as shown in FIG. 29. Planarization of transistor 200 may include removal of materials such that one or more portions of insulating layer 136 are exposed at the planar surface. After planarization of transistor 200, conductive material 210 in trenches 206 forms local interconnects 212A to trench contacts 132 and conductive material 210 in trench 208 forms local interconnect 212B to gate open trench contact 204. As shown in FIG. 29, gate open trench contact 204 has an interface with local interconnect 212B instead of the local interconnect and the gate open trench being a continuous material (e.g., local interconnect 144C and gate open trench 142 depicted in FIG. 17).

In certain embodiments, as shown in FIG. 29, local interconnects 212A and 212B are thicker than local interconnects used in other routing schemes because of the bidirectional routing and use of gate open trench contact 204. Using thicker local interconnects may improve transistor performance by providing lower resistances in the local interconnect layer. In certain embodiments, routing with local interconnects 212A and 212B between trench contacts 132 and gate open trench contact 204 provides better cell density and allows for better technology scaling (e.g., scaling down to 15 nm technology) and/or reduced size of library cells. In some embodiments, routing with local interconnects 212A and 212B between trench contacts 132 and gate open trench contact 204 provides routing flexibility by allowing multiple options for routing between the trench contacts and/or the gate open trench in insulating layer 136.

The process embodiments depicted in FIGS. 2-29 may utilize self-aligning trench contacts that connect to source/drains of the gates to produce a simple local interconnect scheme that extends above a replacement gate flow and connects to the trench contacts and a gate. Some process embodiments depicted herein may provide lower gate to trench contact and local interconnect coupling capacitance. Using the process embodiments depicted herein may further reduce the number of resistive interfaces between layers as compared to previous replacement gate flow connection schemes. Additionally, the self-alignment process embodiments described herein may provide a better manufacturing yield as the potential for misalignments between contacts is reduced and the processes described herein provide a simpler process flow than previous replacement gate flow connection schemes and/or process flows that utilize selective etch layers and more restrictive alignment rules.

The process embodiments described above for FIGS. 2-29 may be used to form any semiconductor device that utilizes a replacement gate flow such as shown in FIG. 2. For example, the above described embodiments may be used to form semiconductor devices used for microprocessors, storage devices (e.g., SRAM devices), mobile technology devices, or any other device technology that utilizes replacement gate flows during manufacturing.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed:

1. A semiconductor device comprising:
    a transistor comprising a plurality of replacement metal gates on a semiconductor substrate, wherein the transistor comprises first gates and at least one second gate, wherein the first gates have sources and drains and the at least one second gate is isolated from the first gates;
    gate spacers of a first insulating material around each first gate;
    a first insulating layer of a second insulating material between the gate spacers, wherein at least some of the second insulating material overlies sources and drains of the first gates;
    one or more insulating mandrels aligned over the first gates and the at least one second gate, wherein the insulating mandrels comprise the first insulating material;
    mandrel spacers around each insulating mandrel, wherein the mandrel spacers comprise the first insulating material;
    one or more first contacts to the sources and drains of the first gates through the first insulating layer between the mandrel spacers;
    a second contact to the at least one second gate through the first insulating material above the second gate;
    a third insulating layer over the transistor; and
    one or more local interconnects that contact the first contacts and the second contact through the third insulating layer.

2. The device of claim 1, wherein the second contact to the at least one second gate is through the mandrel above the second gate.

3. The device of claim 1, wherein each insulating mandrel has approximately the same width as its underlying gate with each mandrel being at least as wide as its underlying gate.

4. The device of claim 1, wherein each mandrel spacer has a profile that slopes from being wider at the bottom to narrower at the top.

5. The device of claim 4, wherein the first contacts have a profile that matches the slope of the mandrel spacers such that the first contacts are wider at the top than at the bottom.

6. The device of claim 1, wherein the first contacts are not shorted to the gates.

7. The device of claim 1, wherein the third insulating layer comprises the second insulating material.

8. The device of claim 1, wherein the first gates are located in an active region of the semiconductor device and the second gate is located in an isolation region of the semiconductor device.

9. A non-transitory computer readable storage medium storing a plurality of instructions which, when executed, generate a semiconductor device that comprises:
    a transistor comprising a plurality of replacement metal gates on a semiconductor substrate, wherein the transistor comprises first gates and at least one second gate, wherein the first gates have sources and drains and the at least one second gate is isolated from the first gates;
    gate spacers of a first insulating material around each first gate;
    a first insulating layer of a second insulating material between the gate spacers, wherein at least some of the second insulating material overlies sources and drains of the first gates;
    one or more insulating mandrels aligned over the first gates and the at least one second gate, wherein the insulating mandrels comprise the first insulating material;
    mandrel spacers around each insulating mandrel, wherein the mandrel spacers comprise the first insulating material;
    one or more first contacts to the sources and drains of the first gates through the first insulating layer between the mandrel spacers;
    a second contact to the at least one second gate through the first insulating material above the second gate;
    a third insulating layer over the transistor; and
    one or more local interconnects that contact the first contacts and the second contact through the third insulating layer.

10. The non-transitory computer readable storage medium of claim 9, wherein the second contact to the at least one second gate is through the mandrel above the second gate.

11. The non-transitory computer readable storage medium of claim 9, wherein each insulating mandrel has approximately the same width as its underlying gate with each mandrel being at least as wide as its underlying gate.

12. The non-transitory computer readable storage medium of claim 9, wherein each mandrel spacer has a profile that slopes from being wider at the bottom to narrower at the top.

13. The non-transitory computer readable storage medium of claim 12, wherein the first contacts have a profile that matches the slope of the mandrel spacers such that the first contacts are wider at the top than at the bottom.

14. The non-transitory computer readable storage medium of claim 9, wherein the first contacts are not shorted to the gates.

15. The non-transitory computer readable storage medium of claim 9, wherein the third insulating layer comprises the second insulating material.

16. The non-transitory computer readable storage medium of claim 9, wherein the first gates are located in an active region of the semiconductor device and the second gate is located in an isolation region of the semiconductor device.

* * * * *